United States Patent
Nieuwoudt et al.

(10) Patent No.: US 9,892,218 B2
(45) Date of Patent: Feb. 13, 2018

(54) PARASITIC-AWARE BLOCKAGE

(71) Applicant: Synopsys, Inc., Mountain View, CA (US)

(72) Inventors: Arthur B. Nieuwoudt, San Carlos, CA (US); Claude Helmstetter, Saint Ismier (FR); Arindam Chatterjee, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 57 days.

(21) Appl. No.: 15/089,334

(22) Filed: Apr. 1, 2016

(65) Prior Publication Data

US 2017/0286576 A1   Oct. 5, 2017

(51) Int. Cl.
G06F 17/50 (2006.01)

(52) U.S. Cl.
CPC ...... *G06F 17/5009* (2013.01); *G06F 17/5081* (2013.01)

(58) Field of Classification Search
CPC .......................... G06F 17/5081; G06F 17/5009
USPC .................................. 716/111, 136; 703/15
See application file for complete search history.

(56) References Cited

U.S. PATENT DOCUMENTS

| | | | | |
|---|---|---|---|---|
| 5,046,017 A * | 9/1991 | Yuyama | ............... | G06F 17/5077 716/113 |
| 5,452,224 A * | 9/1995 | Smith, Jr. | ........... | G06F 17/5081 706/921 |
| 5,847,967 A * | 12/1998 | Asao | .................... | G06F 17/5081 716/115 |
| 5,903,469 A * | 5/1999 | Ho | ....................... | G06F 17/5081 716/115 |
| 6,175,947 B1 * | 1/2001 | Ponnapalli | .......... | G06F 17/5036 716/115 |
| 6,421,814 B1 * | 7/2002 | Ho | ....................... | G06F 17/5081 716/113 |
| 6,539,533 B1 * | 3/2003 | Brown, III | .......... | G06F 17/5068 257/E27.105 |
| 6,854,100 B1 * | 2/2005 | Chuang | ............... | G06F 17/5036 716/115 |
| 8,732,628 B1 * | 5/2014 | Wu | .......................... | G03F 1/38 430/30 |
| 8,984,468 B1 * | 3/2015 | Su | ....................... | G06F 17/5081 703/14 |

(Continued)

*Primary Examiner* — Phallaka Kik
(74) *Attorney, Agent, or Firm* — Bever, Hoffman & Harms, LLP

(57) ABSTRACT

A parasitic-aware blockage structure is provided to replace a detailed blockage structure for use in connection with a capacitance extraction operation. The parasitic-aware blockage structure includes one or more parasitic-aware blockage polygons, each representing a plurality of polygons of the detailed blockage structure. The parasitic-aware blockage polygons can be formed by expanding and merging the polygons of the detailed blockage structure. Physical information is associated with each of the parasitic-aware blockage polygons, wherein the physical information defines physical characteristics of the polygons of the detailed blockage structure. Capacitance error information may also be associated with each of the parasitic-aware blockage polygons, specifying capacitive errors of the parasitic-aware blockage polygons with respect to the polygons of the detailed blockage structure.

22 Claims, 15 Drawing Sheets

(56) References Cited

U.S. PATENT DOCUMENTS

| | | | |
|---|---|---|---|
| 2002/0068989 A1* | 6/2002 | Ebisawa | G06F 17/5068 |
| | | | 700/121 |
| 2003/0057571 A1* | 3/2003 | Yamada | G06F 17/5036 |
| | | | 257/786 |
| 2009/0187866 A1* | 7/2009 | Ou | G06F 17/5009 |
| | | | 716/136 |
| 2010/0262940 A1* | 10/2010 | Dewey, III | G06F 17/5081 |
| | | | 716/106 |
| 2012/0056635 A1* | 3/2012 | Oomura | G06F 21/86 |
| | | | 324/713 |
| 2013/0091480 A1* | 4/2013 | Horlacher | G06F 17/5031 |
| | | | 716/113 |

* cited by examiner

PARASITIC-AWARE BLOCKAGE

FIELD OF THE INVENTION

The present invention relates to a parasitic-aware blockage representation generated from a detailed layout, wherein the parasitic-aware blockage representation facilitates accurate and efficient parasitic capacitance extraction.

RELATED ART

FIG. 1 is a block diagram illustrating a top level design of an integrated circuit chip 100. Different blocks 101, 102 and 103 are included in the top level chip design. The various blocks 101-103 are typically designed in isolation from one another, such that all of the geometries of an individual block may not be available/complete while the top level design is being performed. Thus, a subset of the block geometries is included in a simulation for the top level design. In general, the terminal connections of the various blocks 101-103 are known, and are used to establish the required connections between the blocks. In the example illustrated by FIG. 1, block 101 includes terminal connections 101A, 101B and 101C, and block 102 includes terminal connections 102A, 102B and 102C. A place and route method is used to establish connections 111, 112 and 113 between terminal connections 101A, 101B and 101C and terminal connections 102A, 102B and 102C, respectively. In the illustrated example, the connections 111-113 extend over circuit block 103, which is positioned between blocks 101 and 102 in the top level design. Block 103 includes underlying conductive structures 110, which result in parasitic capacitances on the connections 111-113. These parasitic capacitances, which can affect the transmission of signals on connections 111-113, must be calculated in order to ensure adequate performance of the signals transmitted on connections 111-113. The presence of underlying conductive structures 110 can also affect the resistances of connections 111-113.

In order to determine the parasitic capacitances associated with connections 111-113, a parasitic capacitance extraction operation is performed, wherein the underlying conductor structure 110 of block 103 is effectively grounded, and the parasitic capacitances between the underlying conductor structure 110 and the connections 111-113 are calculated, based on the physical characteristics of the top level design. These calculated parasitic capacitances are used to estimate the capacitance effect of the underlying conductor structure 110 on the connections 111-113.

The pattern used to represent the underlying conductor structure 110 for purposes of parasitic capacitance extraction is referred to as 'blockage' (because this pattern may block the place and route method from placing other interconnect structures at the same locations).

In parasitic capacitance extraction, blockage provides a physical representation of layout 110 to be added in the future. Examples include (1) blockage for standard cells and (2) blockage for macro blocks that will ultimately be included in gate-level designs. The blockage geometries provide a means to estimate the impact of the future layout on the resistance and capacitance of the existing layout in a design. Spacing or density dependent process variations, which impact resistance and capacitance, are computed based on the blockage polygons. Blockage generation and extraction is an important aspect of general gate-level extraction and physical design. Blockage is typically generated in the physical domain.

FIG. 2A illustrates the underlying conductor structure 110 as a pattern 200A of conductors (including cell contacts 201-205, shown as shaded regions). Pattern 200A corresponds with the exact representation of the layout shapes of one or more metal layers located below connections 111-113. Note that this detailed pattern 200A may be used as the blockage for the parasitic capacitance extraction process. Pattern 200A contains many small geometries, which will result in an accurate parasitic capacitance extraction. However, the many small geometries of blockage pattern 200A will undesirably result in a relatively slow (long) parasitic capacitance extraction process.

At another extreme, the underlying conductor structure 110 is represented by one or more simple geometries (e.g. plates) that cover the region where the future layout is to be placed. FIG. 2B illustrates a simple blockage pattern 200B, which represents the underlying conductor structure 110 as a solid conductive plate. In this embodiment, the simple structure of blockage pattern 200B advantageously results in a relatively fast parasitic capacitance extraction process. However, the accuracy of the parasitic capacitance extraction process is much lower when using blockage pattern 200B, with a decreased correlation between the blockage parasitics associated with the blockage pattern 200B and the parasitics ultimately contributed by the detailed layout pattern 200A.

The disadvantages of the aforementioned method for generating the blockage pattern 200B is (1) it does not explicitly consider the electrical characteristics of the underlying layout 110, and (2) it does not capture electrical information associated with the underlying polygons that can be used for faster or more accurate extraction. Consequently, existing methods for blockage generation in the physical domain are sub-optimal with respect to the speed and/or accuracy of parasitic extraction, and no mechanism exists to selectively optimize this speed vs. accuracy trade-off, taking into account the parasitic impact of the blockage. It would therefore be desirable to have improved methods for creating blockage with a desired speed or accuracy for a given application.

SUMMARY

Accordingly, the present invention provides a parasitic-aware blockage structure to replace a detailed blockage layout structure for use in connection with a capacitance extraction operation. The parasitic-aware blockage structure includes one or more parasitic-aware blockage polygons, each representing a plurality of polygons of the detailed blockage layout structure. The parasitic-aware blockage polygons can be formed by iteratively expanding and merging the polygons of the detailed blockage layout structure. Physical information is associated with each of the parasitic-aware blockage polygons, wherein the physical information defines physical characteristics of the polygons of the detailed blockage structure. Capacitance error information may also be associated with each of the parasitic-aware blockage polygons, specifying capacitive errors of the parasitic-aware blockage polygons with respect to the polygons of the detailed blockage layout structure.

Coupling capacitance error information may also be associated with each of the parasitic-aware blockage polygons. The coupling capacitance error specifies differences in the coupling capacitances between conductors that are fabricated adjacent to the parasitic-aware blockage polygons, when compared with the coupling capacitances between the same conductors, when fabricated adjacent to the detailed blockage layout structure.

Resistance error information may also be associated with each of the parasitic-aware blockage polygons, wherein the resistance error information specifies differences in the resistances of conductors fabricated adjacent to the parasitic-aware blockage polygons (in the same metal layer), when compared with the resistances of the same conductors, when fabricated adjacent to the detailed blockage layout structure (in the same metal layer).

The present invention will be more fully understood in view of the following description and drawings.

DETAILED DESCRIPTION

In general, the present invention provides a parasitic-aware blockage representation generated from an underlying detailed layout, wherein the parasitic-aware blockage facilitates accurate and efficient parasitic capacitance extraction. The parasitic-aware blockage representation includes one or more physical blockage polygons and/or holes, which are generated based on physical and electrical rules. Each physical blockage polygon includes associated physical and/or electrical information to accurately capture the characteristics of the associated detailed layout. Parasitic-aware blockage is generated based on any of following criteria: (1) width, spacing, uniformity, and/or sparsity of the underlying detailed layout, (2) ground capacitance errors between the blockage and nearby conductors, (3) coupling capacitance errors between two signal conductors near the blockage due to blockage conductor shielding, and (4) resistance errors due to spacing or density dependent process variations.

In one embodiment, the parasitic-aware blockage can be generated using an iterative process, wherein the number of polygons in the parasitic-aware blockage is minimized while meeting an error constraint.

In one embodiment, information associated with the parasitic-aware blockage can include: (1) the density of the underlying polygons of the detailed layout, (2) statistics on the X/Y width and spacing of the underlying polygons of the detailed layout (e.g. average, minimum, maximum), and (3) the level of potential error versus the underlying polygons of the detailed layout.

In accordance with one embodiment, extraction simultaneously leverages parasitic-aware blockage geometries and their associated data to provide a tunable speed-versus-accuracy trade-off. In this manner, the parasitic-aware blockage representation provides a means to obtain a desired extraction speed or accuracy for a given application.

The present invention will now be described in more detail.

Figure 2A:
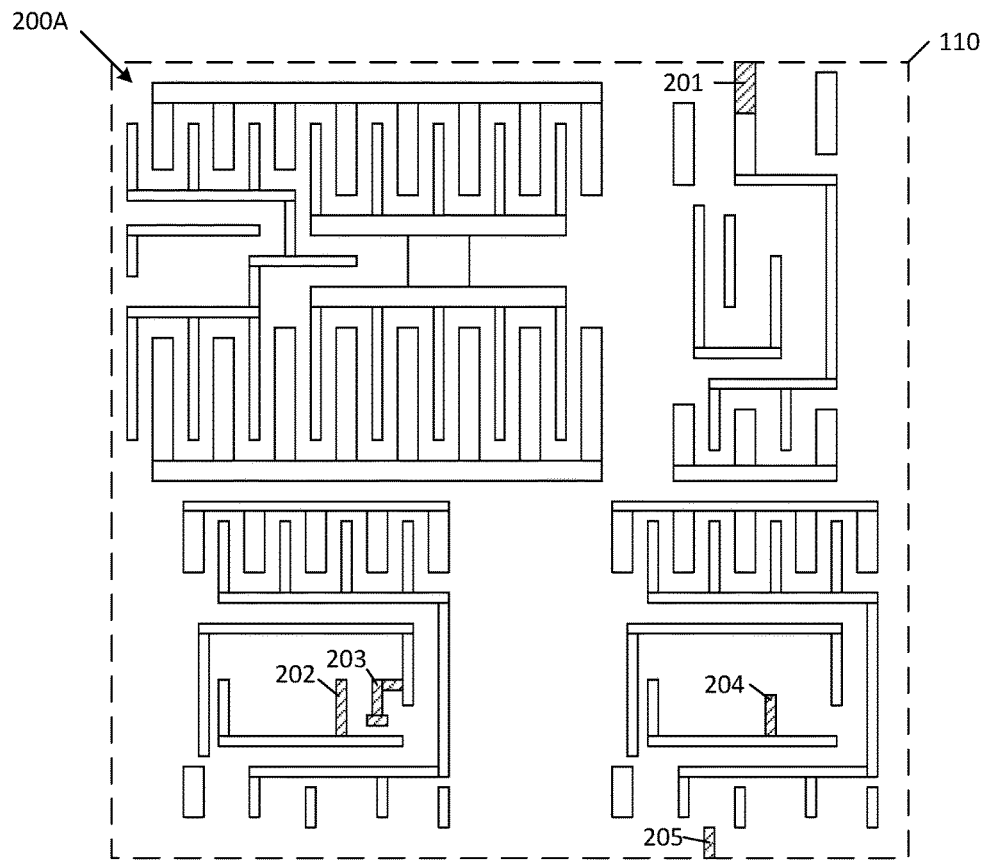
FIG. 2A is a block diagram illustrating a detailed blockage pattern that can be used for parasitic capacitance extraction in connection with the top level design of FIG. 1.
Figure 3:
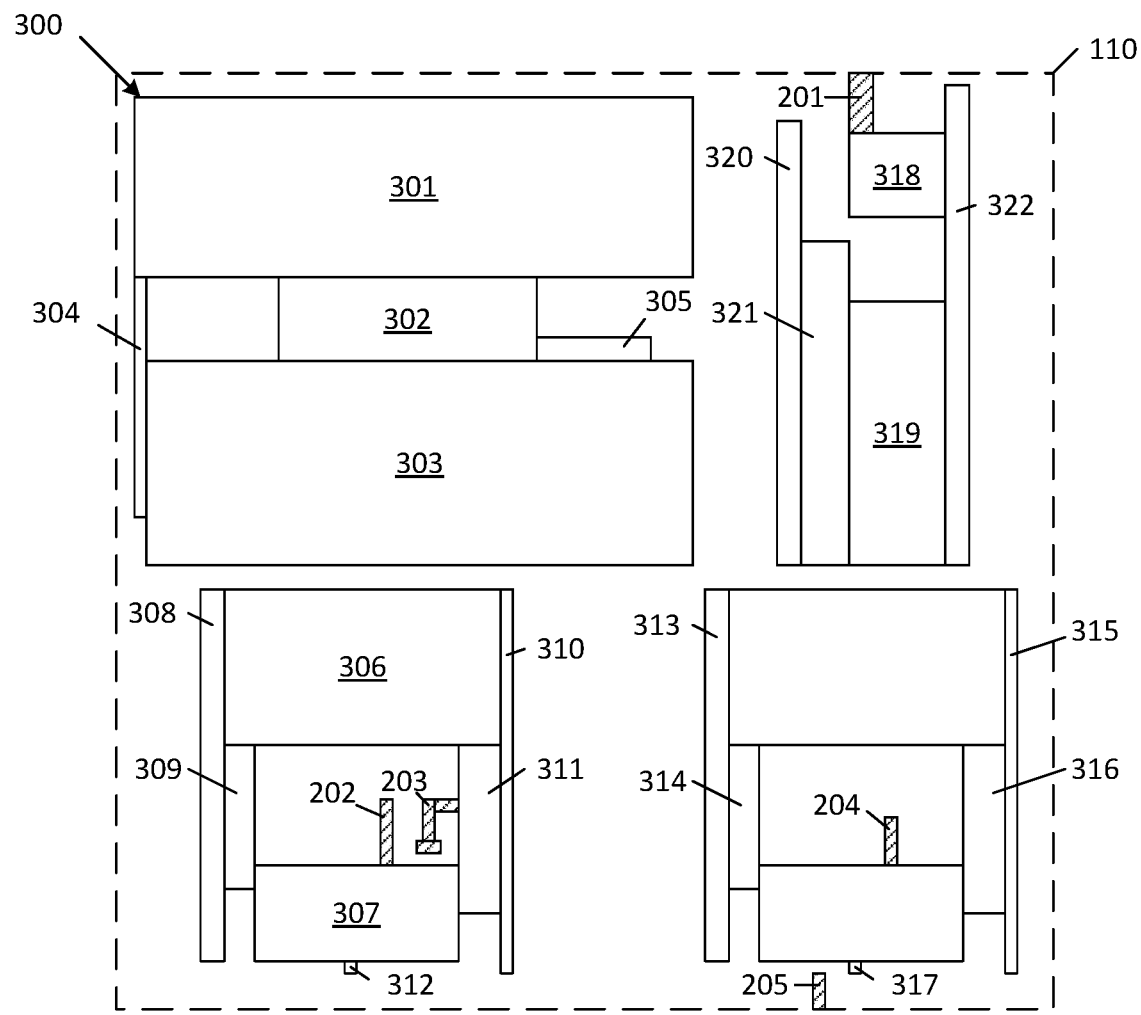
FIG. 3 is a block diagram illustrating parasitic-aware blockage pattern that can be used for parasitic capacitance extraction in accordance with one embodiment of the present invention.

FIG. 3 is a block diagram illustrating a parasitic-aware blockage pattern 300, which is generated from the detailed conductor layout 200A of FIG. 2A, in accordance with one embodiment of the present invention. Parasitic-aware blockage pattern 300 simplifies the various small conductors of the detailed layout 200A into a plurality of polygons 301-322. Note that in the illustrated embodiments, the cell contacts 201-205 are not modified in the parasitic-aware blockage pattern 300 (thereby allowing for connections to these cell contacts). Although polygons 301-322 are squares/rectangles in the illustrated embodiments, it is understood that other polygons can be used in other embodiments.

As described in more detail below, information is associated with each of the polygons 301-322, wherein this information defines various characteristics of the associated conductors of the detailed conductor layout 200A. This information can include, for example, the density of the associated conductors of the detailed layout 200A, statistics of the X/Y width and spacing of the associated conductors of the detailed layout 200A (e.g., average width/spacing, minimum width/spacing, maximum width spacing), and level of potential RC error versus the associated conductors of the detailed layout 200A.

When performing the parasitic capacitance extraction, the polygons 301-322 and their associated information are simultaneously used to determine the parasitic capacitances to conductors that extend over the parasitic aware blockage pattern 300. As will become apparent in view of the subsequent description, the use of polygons 301-322 (and their associated information) provide a more accurate parasitic capacitance extraction result than the simple blockage 200B, and also provide a faster parasitic capacitance extraction runtime than the detailed layout blockage 200A.

A specific example of parasitic-aware blockage generation will now be described. This example can be used to generate any of the polygons 301-322 of FIG. 3.

Figure 4:
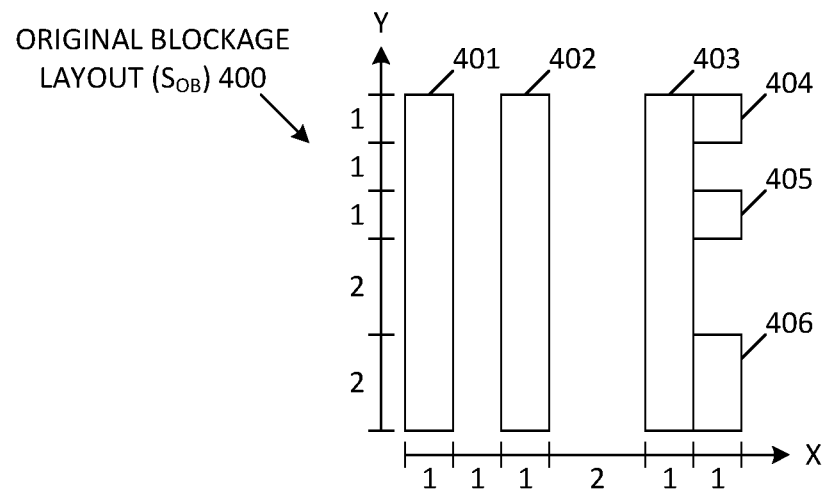
FIG. 4 is a block diagram of an exemplary original detailed blockage layout.

FIG. 4 is a block diagram 400 of an original (detailed) blockage layout 400, which includes conductive elements 401-406. The collection of shapes included in the original detailed blockage layout 400 may be generally identified as $S_{OB}$. The detailed blockage layout 400 generally corresponds with conductors in the detailed layout blockage 200A. The various dimensions of conductive elements 401-406 are illustrated as generic units. Thus, detailed blockage layout 400 covers a 7×7 grid. Original conductive elements 401-403 each have a width of 1 unit along the x-axis, and a width of 7 units along the y-axis. Original conductive elements 404 and 405 each have a width of 1 unit along the x-axis and a width of 1 unit along the y-axis. Original conductive element 406 has a width of 1 unit along the x-axis and a width of 2 units along the y-axis.

Figure 1:
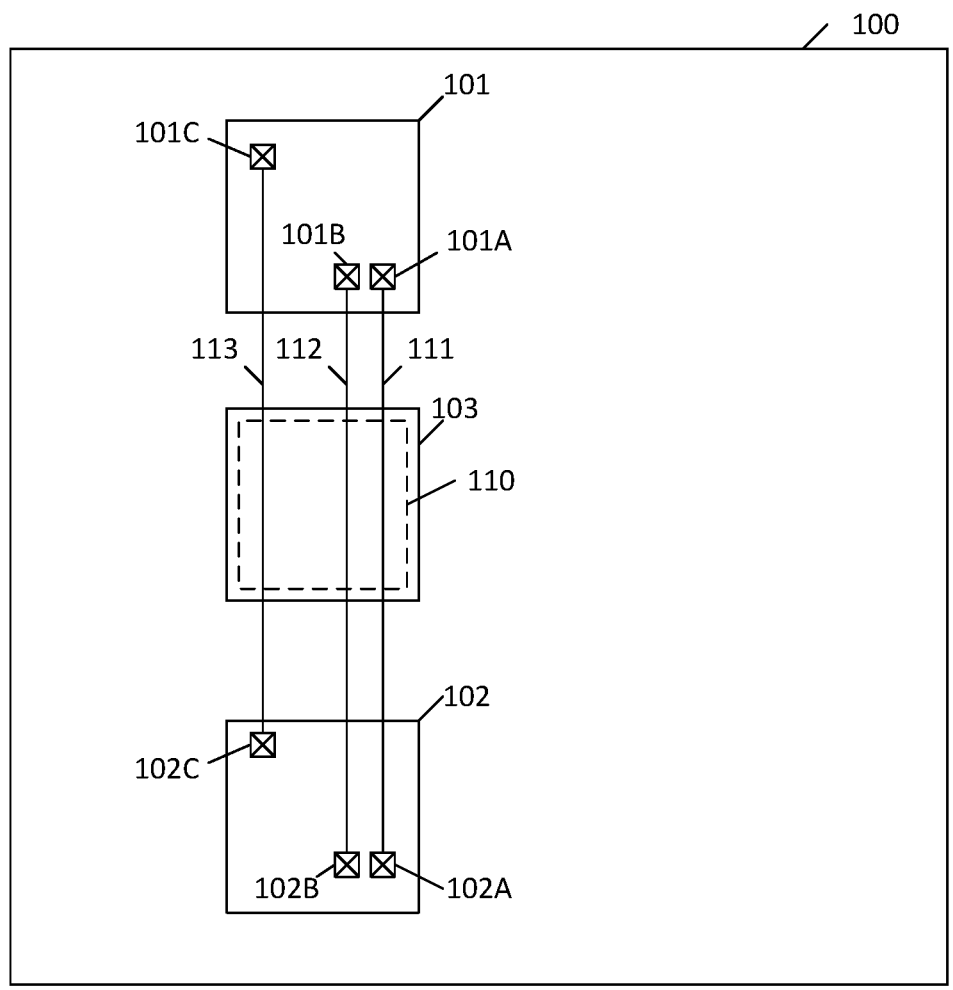
FIG. 1 is a block diagram illustrating a top level design of an integrated circuit chip.
Figure 5:
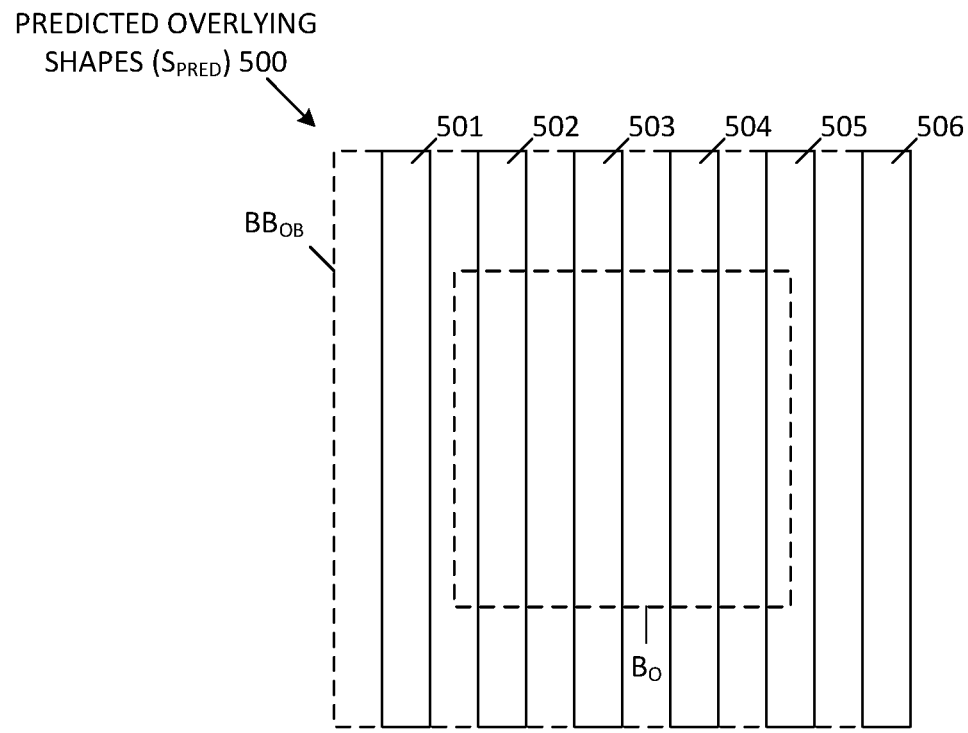
FIG. 5 is a block diagram of an exemplary predicted neighboring conductor layout, which may be located adjacent to the original detailed blockage layout of FIG. 4.

FIG. 5 is a block diagram of a predicted neighboring conductor layout 500, which includes conductive elements 501-506. Conductive elements 501-506 represent conductors that may surround (e.g., be routed over) the original blockage layout 400. The collection of shapes included in the predicted neighboring layout 500 may be generally identified as $S_{PRED}$. The predicted conductor layout 500 may generally correspond with the connector elements 111-113 of FIG. 1. The outer perimeter of detailed blockage layout 400 (i.e., the above-described 7×7 grid) is generally illustrated as original box $B_O$ in FIG. 5.

Figure 6:
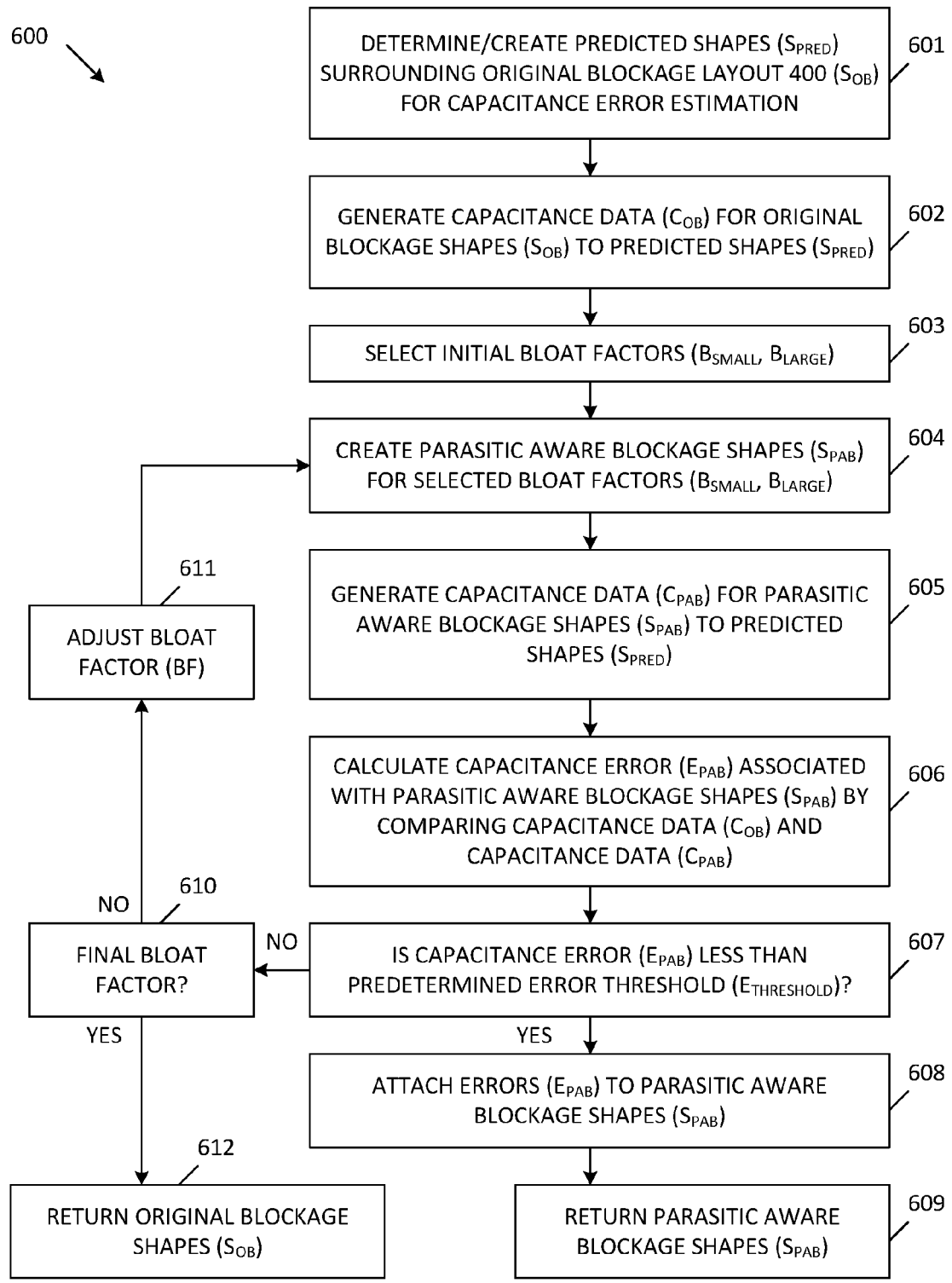
FIG. 6 is a flow diagram that describes a method for generating parasitic-aware blockage structures from a detailed blockage layout in accordance with one embodiment of the present invention.

FIG. 6 is a flow diagram 600 that describes a method for generating parasitic-aware blockage structures from a detailed blockage layout in accordance with one embodiment of the present invention. Initially, the predicted shapes $S_{PRED}$ surrounding the original blockage layout shapes $S_{OB}$ are determined/created (Step 601).

Figure 7:
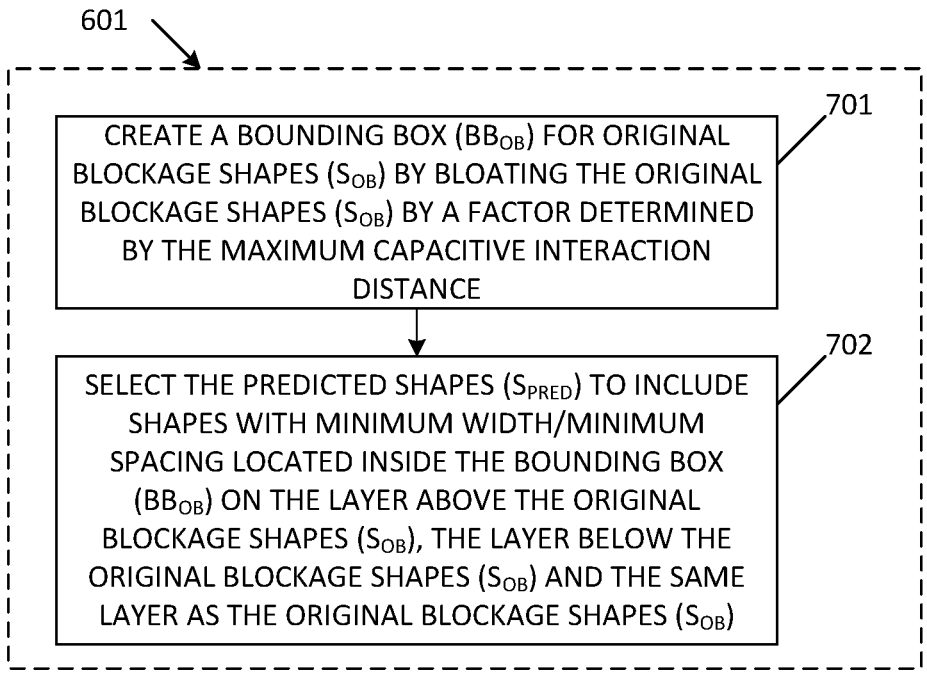
FIG. 7 is a flow diagram illustrating steps for determining predicted neighboring layout shapes in accordance with step 601 of FIG. 6, in accordance with one embodiment.

FIG. 7 is a flow diagram illustrating steps 701-702 that can be performed to implement the process of Step 601, in accordance with one embodiment. A bounding box ($BB_{OB}$) is created by bloating (expanding) the original box $B_O$ that defines the outer boundaries of the original blockage layout shapes $S_{OB}$ (Step 701). In the described embodiments, the original box $B_O$ is bloated beyond the outer boundaries of the original blockage layout shapes $S_{OB}$ by a factor specified by a maximum capacitive interaction distance. FIG. 5 illustrates one example of an original box $B_O$ and a corresponding bounding box $BB_{OB}$.

The predicted shapes $S_{PRED}$ are then selected to include shapes having a minimum width and a minimum spacing within the bounding box (Step 702). The predicted shapes $S_{PRED}$ can be located within the bounding box on the layer above the original blockage layout shapes $S_{OB}$, on the layer below the original blockage layout shapes $S_{OB}$, and/or the same layer as the original blockage layout shapes $S_{OB}$. Predicted shapes $S_{PRED}$ on the same layers as the original layout shapes $S_{OB}$ are only added if they do not violate the processes minimum spacing rules. That is, the predicted shapes $S_{PRED}$ must not overlap or be too close to the original layout shapes $S_{OB}$.

Figure 8:
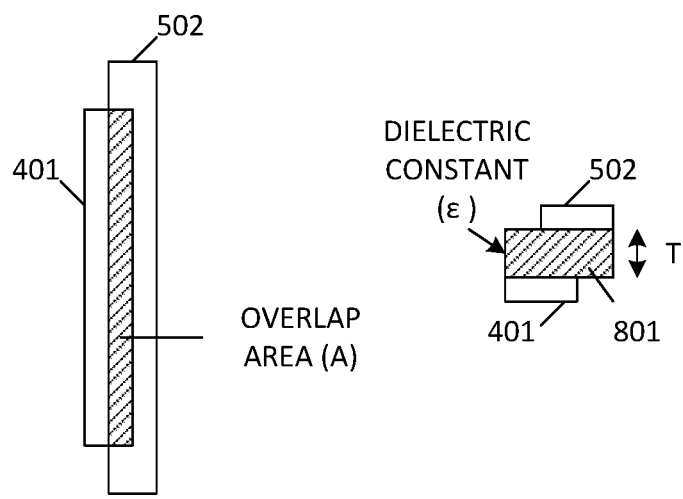
FIG. 8 is a block diagram illustrating top and cross sectional views of an original blockage layout shape of FIG. 4 and a predicted neighboring conductor shape of FIG. 5.

Returning to FIG. 6, capacitance data ($C_{OB}$) for the original layout shapes ($S_{OB}$) to the predicted shapes ($S_{PRED}$) is generated in step 602. FIG. 8 is a block diagram illustrating top and cross sectional views of original blockage layout shape 401 and predicted shape 502. The capacitance between the original blockage layout shape 401 and the predicted shape 502 can be determined from the overlap area (A) between these shapes, the thickness (T) of the dielectric material 801 between these shapes, and the dielectric constant (s) of the dielectric material 801 between these shapes. More specifically, the capacitance ($C_{OB}$) between original blockage layout shape 401 and predicted shape 502 can be determined as (E*A)/T. The capacitance ($C_{OB}$) is determined between each original blockage layout shape ($S_{OB}$) and each of the predicted shapes ($S_{PRED}$). Although a relatively simple method for calculating the capacitance ($C_{OB}$) is described, it is understood that other embodiments can use any common capacitance modeling technique, including more complex analytic formulas, pattern-matching capacitance modeling approaches, and field solver based modeling approaches.

Initial bloat factors (BF) are then selected (Step 603), wherein the bloat factors specify dimensions by which the original blockage layout shapes ($S_{OB}$) are to be expanded to create the parasitic-aware blockage shapes $S_{PAB}$. In accordance with one embodiment, a first bloat factor ($B_{SMALL}$) is applied to small original blockage layout shapes, and a second bloat factor ($B_{LARGE}$) is applied to larger original blockage layout shapes. In the example of FIG. 4, original blockage layout shapes 404-406 are considered to be small shapes subject to the first bloat factor $B_{SMALL}$, while original blockage layout shapes 401-403 are considered to be large shapes subject to the second bloat factor $B_{LARGE}$. In one embodiment, large shapes are defined as those shapes that traverse at least a certain percentage (e.g., 50%, 75%, 100% of the lateral dimensions of the original box $B_O$). In another embodiment, large shapes are defined as those shapes having a largest dimension that exceeds a certain absolute length. In the example of FIG. 4, large shapes could be defined as those shapes having an absolute length greater than 4 units along either the X or Y axis. In yet another embodiment, a combination of these factors can be used to specify large shapes. In the simplified examples described herein, the first bloat factor $B_{SMALL}$ can have values of 1.0 unit and 0.5 units, and the second bloat factor $B_{LARGE}$ can also have values of 1.0 unit and 0.5 units. However, it is understood that other bloat factors (and other numbers of bloat factors) can be used in other embodiments.

Parasitic-aware blockage shapes ($S_{PAB}$) are then created by applying the selected bloat factors $B_{SMALL}$ and $B_{LARGE}$ to the original blockage layout shapes $S_{OB}$ (Step 604).

Figure 9:
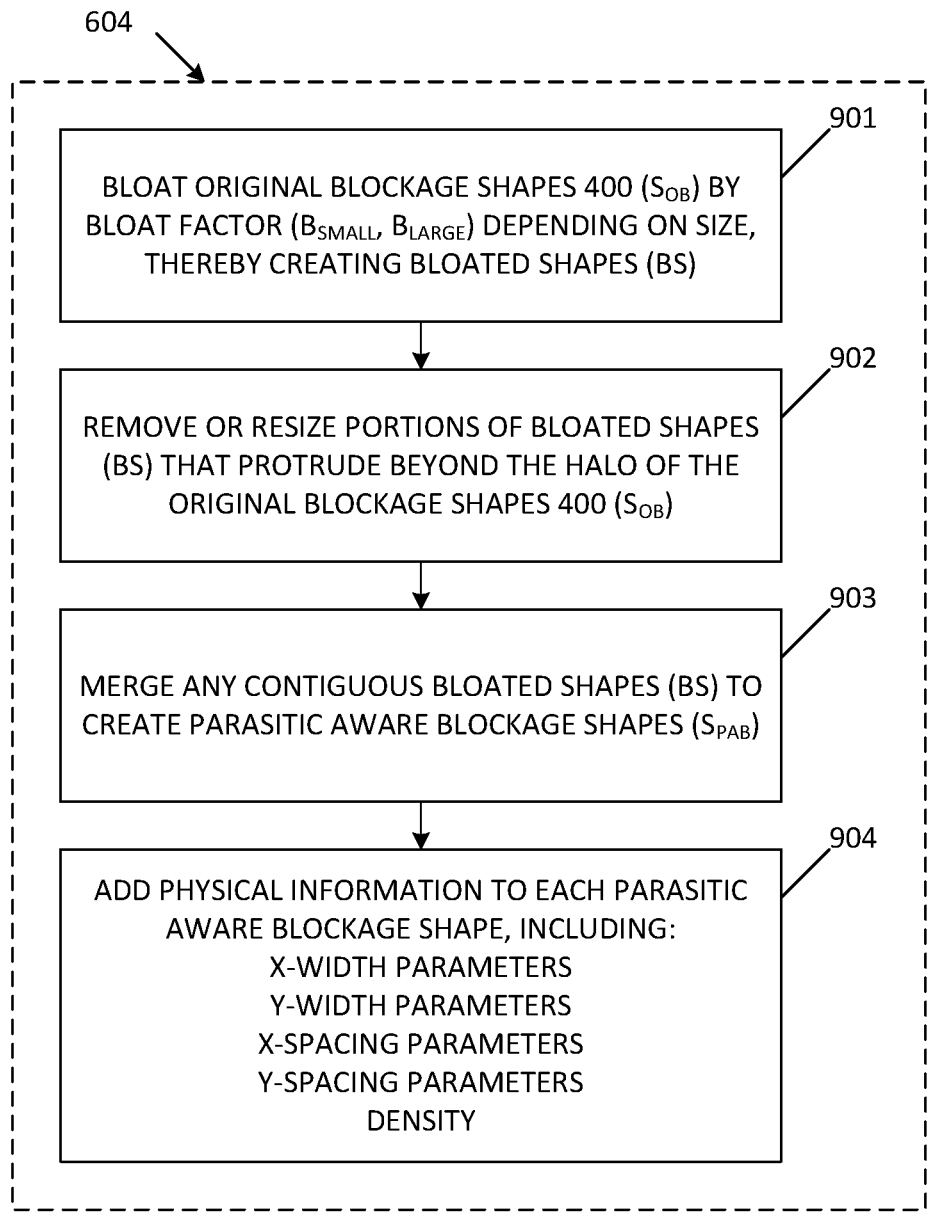
FIG. 9 is a flow diagram illustrating a method for creating parasitic-aware blockage shapes in accordance with step 604 of FIG. 6, in accordance with one embodiment.
Figure 10A:
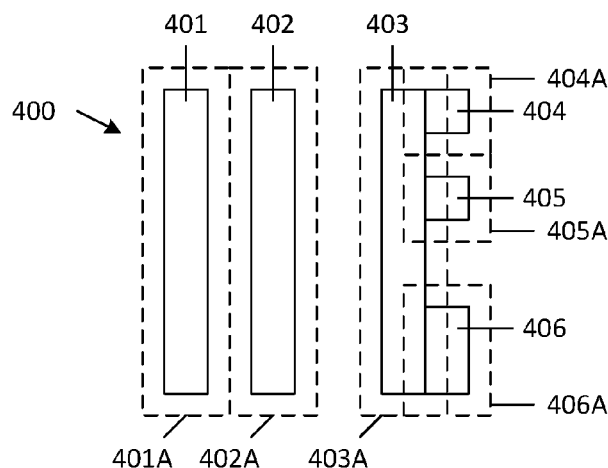
FIG. 10A is a block diagram illustrating the original blockage layout shapes of FIG. 4 expanded by a bloat factor in accordance with step 901 of FIG. 9.
Figure 10B:
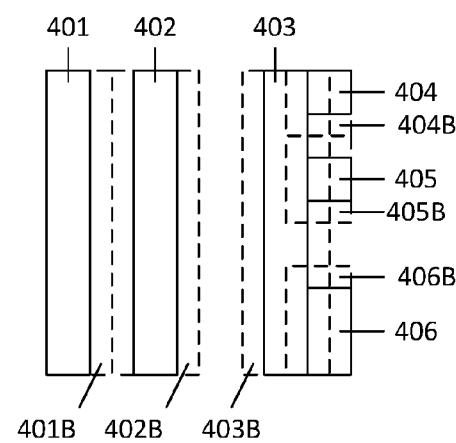
FIG. 10B is a block diagram illustrating the expanded original blockage shapes of FIG. 10A, which are cropped to eliminate portions located outside of an original boundary of the original blockage layout shapes, in accordance with step 902 of FIG. 9.
Figure 10C:
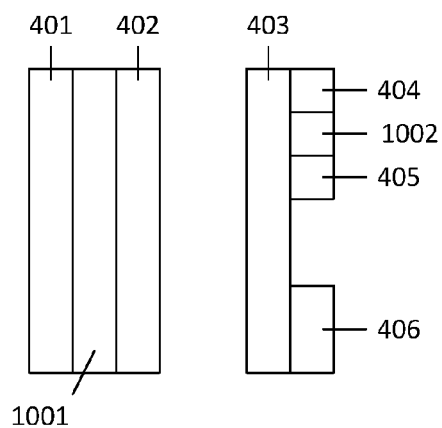
FIG. 10C is a block diagram illustrating resulting merged portions of the expanded and cropped original blockage layout shapes of FIG. 10B, in accordance with step 903 of FIG. 9.
Figure 10D:
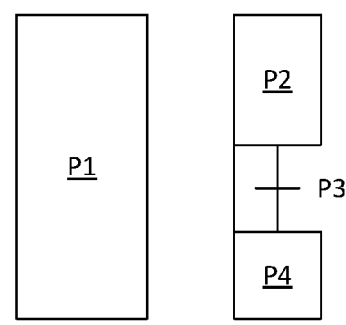
FIG. 10D is a block diagram illustrating parasitic-aware blockage shapes, which are formed from the original blockage layout shapes and the merged portions of FIG. 10C in accordance with one embodiment.

FIG. 9 is a flow diagram illustrating a method for implementing step 604 in accordance with one embodiment. The original blockage layout shapes 401-406 are expanded by an associated bloat factor ($B_{SMALL}$, $B_{LARGE}$), which is determined by the size of the original blockage layout shapes (small/large) (Step 901). FIG. 10A is a block diagram illustrating the original blockage layout shapes 401-406 expanded by a bloat factor of 0.5 units ($B_{SMALL}=B_{LARGE}=0.5$), thereby creating corresponding bloated shapes 401A-406A. The portions of the bloated shapes 401A-406A that protrude beyond the halo of the original blockage layout shapes 400 (e.g., outside of original box $B_O$) are then removed (Step 902). FIG. 10B is a block diagram illustrating the resulting bloated shapes 401B-406B, which remain after step 902. Any portions of the resulting bloated shapes 401B-406B that were bloated into contact along a single axis are then merged, and any unmerged, unoriginal shapes are eliminated (Step 903). FIG. 10C illustrates the resulting merged portions 1001-1002 from step 903, along with the original blockage layout shapes 401-406. FIG. 10D illustrates the resulting parasitic-aware blockage shapes P1-P4, which are formed from the original blockage layout shapes 401-406 and the merged portions 1001-1002. In the illustrated example, parasitic-aware blockage shape P1 includes original blockage layout shapes 401-402 and merged portion 1001; parasitic-aware blockage shape P2 includes a portion of original blockage layout shape 403, as well as original blockage shapes 404-405 and merged portion 1002; parasitic-aware blockage shape P3 includes a portion of original blockage layout shape 403; and, parasitic-aware blockage shape P4 includes a portion of original blockage layout shape 403, as well as original blockage shape 406. Other combinations of original blockage layout shapes 401-406 and merged portions 1001-1002 can be used to form other parasitic-aware blockage shapes in other embodiments. In general, the original blockage layout shapes and merged portions are combined in a manner that minimizes the number of parasitic-aware blockage shapes.

Physical information is then associated with each of the created parasitic-aware blockage shapes P1-P4 (Step 904). This physical information identifies characteristics of the original blockage layout shapes 400 ($S_{OB}$) underlying each of the parasitic-aware blockage shapes P1-P4, including, for example, X-width parameters, Y-width parameters, X-spacing parameters, Y-spacing parameters, and density. In the example illustrated by FIGS. 10A-10D, parasitic-aware blockage shapes ($S_{PAB}$) P1-P4 exhibit the physical information as set forth below in Tables 1-4.

TABLE 1

Physical Info for Parasitic-aware blockage shape P1

|  | Average | Std. Dev. | Min. | Max |
|---|---|---|---|---|
| X-width | 1 | 0 | 1 | 1 |
| Y-width | 7 | 0 | 7 | 7 |
| X-spacing | 1 | 0 | 1 | 1 |
| Y-spacing | 0 | 0 | 0 | 0 |
| Density | 2/3 | — | — | — |

TABLE 2

Physical Info for Parasitic-aware blockage shape P2

|  | Average | Std. Dev. | Min. | Max |
|---|---|---|---|---|
| X-width | 1.67 | 0.58 | 1 | 2 |
| Y-width | 2 | 1.15 | 1 | 3 |
| X-spacing | 0.33 | 0.58 | 0 | 1 |
| Y-spacing | 0.5 | 0.7 | 0 | 1 |
| Density | 5/6 | — | — | — |

TABLE 3

Physical Info for Parasitic-aware blockage shape P3

|  | Average | Std. Dev. | Min. | Max |
|---|---|---|---|---|
| X-width | 1 | 0 | 1 | 1 |
| Y-width | 2 | 0 | 2 | 2 |
| X-spacing | 0 | 0 | 0 | 0 |
| Y-spacing | 0 | 0 | 0 | 0 |
| Density | 1 | — | — | — |

TABLE 4

Physical Info for Parasitic-aware blockage shape P4

|  | Average | Std. Dev. | Min. | Max |
|---|---|---|---|---|
| X-width | 2 | 0 | 2 | 2 |
| Y-width | 2 | 0 | 2 | 2 |
| X-spacing | 0 | 0 | 0 | 0 |
| Y-spacing | 0 | 0 | 0 | 0 |
| Density | 1 | — | — | — |

Thus, in accordance with Table 2, the portions of original blockage layout shapes 403, 404 and 405 covered by parasitic-aware blockage shape P2 exhibit a maximum X-width of 2 units, a minimum X-width of 1 unit, an average X-width of 1.67 units (i.e., ((2 units*⅓)+(1 unit×⅓)+(2 units*⅓)), and a standard deviation of 0.58 (i.e., sqrt (($(2-1.67)^2$+($1-1.67)^2$+($2-1.67)^2$)/(3−1)). The X-width (and Y-width) values of the other parasitic-aware blockage shapes are calculated in a similar manner.

Also in accordance with Table 2, the portions of original blockage layout shapes 403, 404 and 405 covered by parasitic-aware blockage shape P2 exhibit a maximum X-spacing of 1 unit, a minimum X-spacing of 0 unit, an average X-spacing of 0.33 units (i.e., ((0 units*⅓)+(1 unit×⅓)+(0 units*⅓)), and a standard deviation of 0.58 (i.e., sqrt (($(0-0.33)^2$+$(1-0.33)^2$+$(0-0.33)^2$)/(3−1)). The X-spacing (and Y-spacing) values of the other parasitic-aware blockage shapes are calculated in a similar manner.

Also in accordance with Table 2, the portions of original blockage layout shapes 403, 404 and 405 covered by the parasitic-aware blockage shape P2 have an area that is ⅚ of the area of the parasitic-aware blockage shape P2 (for a density of ⅚). The densities of the other parasitic-aware blockage shapes are calculated in a similar manner.

Figure 11A:
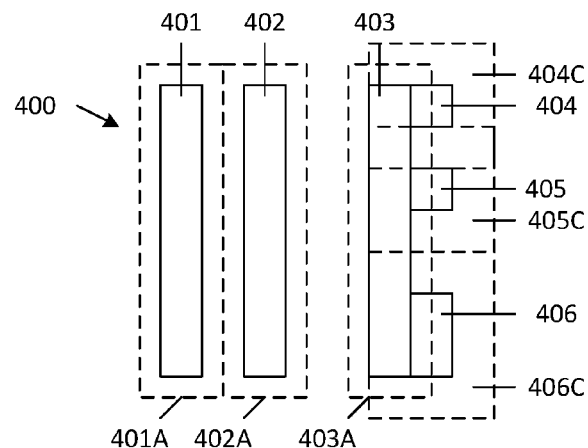
FIGS. 11A, 11B, 11C and 11D are block diagrams illustrating the creation of parasitic-aware blockage shapes from the original blockage layout shapes of FIG. 4, using different bloat factors than those used in connection with FIGS. 10A-10D.
Figure 11B:
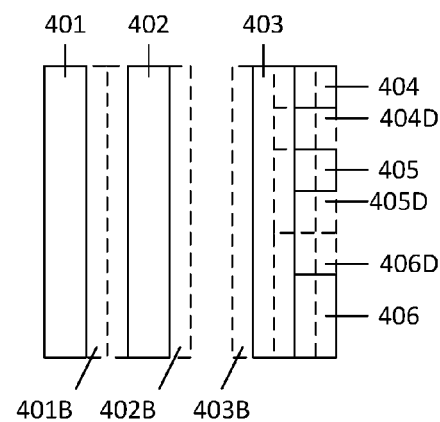
Figure 11C:
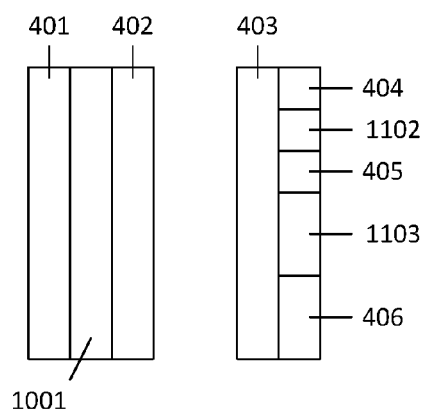
Figure 11D:
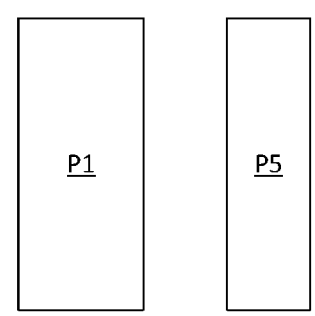

As described in more detail below, the bloat factors ($B_{SMALL}$, $B_{LARGE}$) can be iteratively modified, if necessary, thereby resulting in different parasitic-aware blockage shapes ($S_{PAB}$), which provide different representations of the original blockage layout shapes ($S_{OB}$). FIGS. 11A-11D are block diagrams illustrating the creation of parasitic-aware blockage shapes from the original blockage layout shapes 401-406, when using the bloat factors $B_{SMALL}$=1.0, $B_{LARGE}$=0.5. As illustrated in FIG. 11A, the small shapes 404-406 are bloated by 1.0 unit to create corresponding bloated shapes 404C-406C (and the large shapes 401-403 are bloated by 0.5 units to create bloated shapes 401A-403A). As shown in FIG. 11B, the portions of bloated shapes 401A-403A and 404C-406C extending outside of the original box ($B_O$) are eliminated, thereby leaving corresponding bloated shapes 401B-403B and 404D-406D. FIG. 11C illustrates the overlapping bloated regions 1102-1103, which are located adjacent to original blockage layout shapes 403-406 (as well as the overlapping bloated region 1001, which is located between original blockage shapes 401-402). FIG. 11D illustrates the resulting parasitic aware blocking shapes P1 and P5, wherein the parasitic aware blocking shapes P1 of FIGS. 10D and 11D are identical, and the parasitic aware blocking shape P5 of FIG. 11D, which includes original layout shapes 403-406 and bloated regions 1102-1103, and has the physical characteristics set forth in Table 5 below.

TABLE 5

Physical Info for Parasitic-aware blockage shape P5

|  | Average | Std. Dev. | Min. | Max |
|---|---|---|---|---|
| X-width | 1.57 | 0.53 | 1 | 2 |
| Y-width | 2.75 | 2.87 | 1 | 7 |
| X-spacing | 0.43 | 0.53 | 0 | 1 |
| Y-spacing | 0.75 | 0.96 | 0 | 2 |
| Density | 11/14 | — | — | — |

Figure 12A:
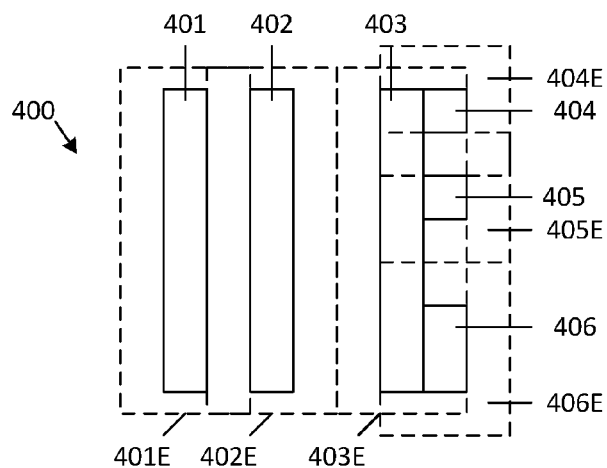
FIGS. 12A, 12B, 12C and 12D are block diagrams illustrating the creation of parasitic-aware blockage shapes from the original blockage layout shapes of FIG. 4, using different bloat factors than those used in connection with FIGS. 10A-10D and FIGS. 11A-11D.
Figure 12B:
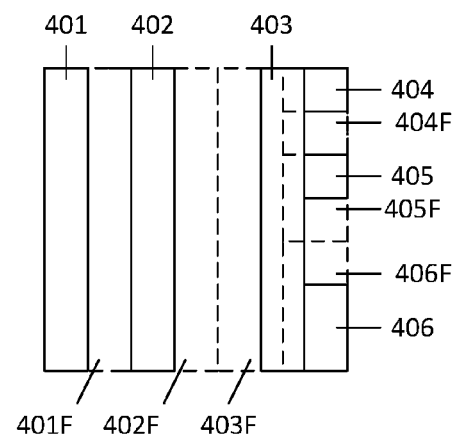
Figure 12C:
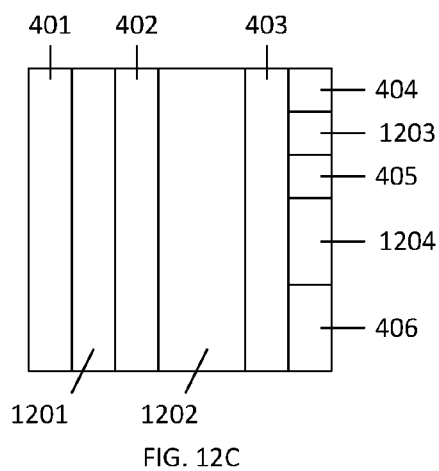
Figure 12D:
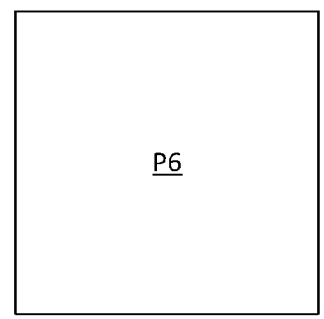

FIGS. 12A-12D are block diagrams illustrating the creation of parasitic-aware blockage shapes from the original blockage layout shapes 401-406, when using bloat factors $B_{SMALL}$=1.0, $B_{LARGE}$=1.0. As illustrated in FIG. 12A, shapes 401-406 are each bloated by 1.0 unit to create corresponding bloated shapes 401E-406E. As shown in FIG. 12B, the portions of bloated shapes 401E-406E extending outside of the original box ($B_O$) are eliminated, thereby leaving corresponding bloated shapes 401F-406F. FIG. 12C illustrates the overlapping bloated regions 1201-1204, which are located adjacent to original blockage layout shapes 401-406. FIG. 12D illustrates the resulting parasitic aware blockage shape P6, which includes the original blockage layout shapes 401-406 and the bloated regions 1201-1204, and has the physical characteristics set forth in Table 6 below. Note that the parasitic-aware blockage shape P6 physically covers the entire original box $B_O$.

TABLE 6

Physical Info for Parasitic-aware blockage shape P6

|  | Average | Std. Dev. | Min. | Max |
|---|---|---|---|---|
| X-width | 1.19 | 0.40 | 1 | 2 |
| Y-width | 3.19 | 3.41 | 0 | 7 |
| X-spacing | 0.50 | 1.43 | 1 | 2 |

TABLE 6-continued

Physical Info for Parasitic-aware blockage shape P6

|  | Average | Std. Dev. | Min. | Max |
|---|---|---|---|---|
| Y-spacing | 3.21 | 3.45 | 0 | 7 |
| Density | 25/42 | — | — | — |

As illustrated by FIGS. 10A-10D, 11A-11D and 12A-12D, the resulting parasitic-aware blockage shapes become more detailed as the bloat factors $B_{SMALL}$, $B_{LARGE}$ are reduced. In accordance with one embodiment, the parasitic-aware blockage shapes ($S_{PAB}$) are initially generated using the maximum bloat factors (e.g., $B_{SMALL}$=1.0 and $B_{LARGE}$=1.0). As a result, a relatively simple parasitic-aware blockage shape (e.g., parasitic-aware blockage shape P6 of FIG. 12D) is initially created. If this simple parasitic-aware blockage shape is determined to have an acceptable associated error (as described below), then it is not necessary to generate more complicated parasitic-aware blockage shapes (e.g., parasitic-aware blockage shapes P1-P4 of FIG. 10D, or P1 and P5 of FIG. 11D).

Figures 13, 14A, 14B:
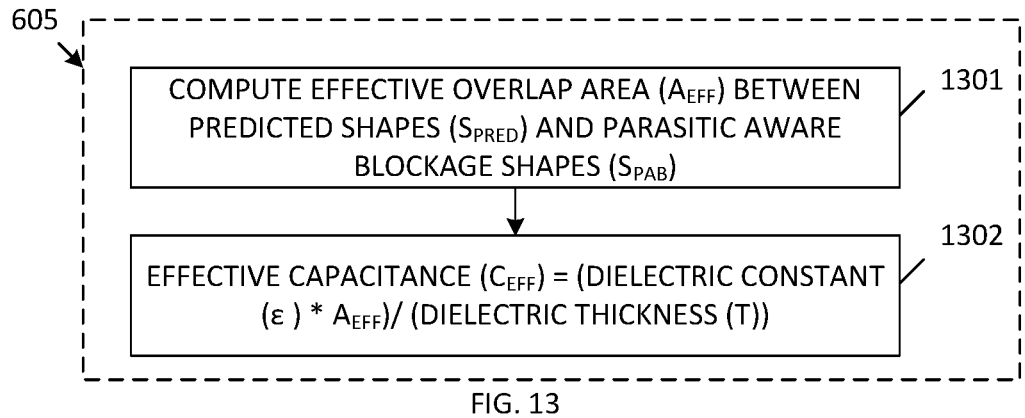
FIG. 13 is a flow diagram illustrating a method for generating capacitance data for parasitic-aware blockage shapes in accordance with step 605 of FIG. 6, in accordance with one embodiment.
FIG. 14A is a block diagram illustrating one method for determining an effective overlap area for generating the capacitance data in accordance with the method of FIG. 13.
FIG. 14B is a block diagram illustrating an alternate method for determining an effective overlap area for generating the capacitance data in accordance with the method of FIG. 13.

Returning now to FIG. 6, after the parasitic-aware blockage shapes ($S_{PAB}$) have been generated, capacitance data ($C_{PAB}$) is generated for the parasitic-aware blockage shapes ($S_{PAB}$) and the predicted layout shapes ($S_{PRED}$) (Step 605). In accordance with one embodiment, this capacitance data ($C_{PAB}$) is generated using the physical information associated with each of the parasitic-aware blockage shapes. FIG. 13 is a flow diagram illustrating a method for implementing step 605 in accordance with one embodiment. First, an effective overlap area ($A_{EFF}$) is determined between each parasitic-aware blockage shape ($S_{PAB}$) and each of the predicted layout shapes ($S_{PRED}$) (Step 1301).

The effective overlap area ($A_{EFF}$) of a parasitic-aware blockage shape ($S_{PAB}$) with respect to a predicted layout shape ($S_{PRED}$) can be determined in various manners using the physical data associated with the parasitic-aware blockage shape ($S_{PAB}$).

FIG. 14A is a block diagram illustrating one method 1301A for implementing step 1301 of FIG. 13. In this method 1301A, the effective overlap area $A_{EFF}$ is set equal to the actual overlap area (A) between the parasitic-aware blockage shape ($S_{PAB}$) and the predicted layout shape ($S_{PRED}$), multiplied by the density of the parasitic aware blockage shape ($S_{PAB}$). As described above, the density of the parasitic aware blockage shape $S_{PAB}$ is determined during step 604 (FIG. 6).

FIG. 14B is a block diagram illustrating an alternate method 1301B for implementing step 1301 of FIG. 13. In this method 1301B, the effective overlap area $A_{EFF}$ is set equal to the actual overlap area (A) between the parasitic-aware blockage shape ($S_{PAB}$) and the predicted layout shape ($S_{PRED}$), multiplied by the following factor:

(Average X-width of $S_{PAB}$+Average Y-width of $S_{PAB}$)/
(Average X-width of $S_{PAB}$+Average Y-width of
$S_{PAB}$+(Average X-spacing of $S_{PAB}$+Average
Y-spacing of $S_{PAB}$)

As described above, the various widths and spacings of the parasitic-aware blockage shape $S_{PAB}$ are determined during step 604 (FIG. 6).

Returning now to FIG. 13, after the effective overlap area ($A_{EFF}$) is determined, the effective capacitance ($C_{EFF}$) between each parasitic aware blockage shape ($S_{PAB}$) and each of the predicted layout shapes ($S_{PRED}$) is calculated (Step 1302) using the equation $C_{EFF}=(\in *A_{EFF})/T$, wherein the variables $\in$ and T are described above in connection with FIG. 8.

Although specific methods for determining the effective overlap area of a parasitic aware blockage shape ($S_{PAB}$) and a predicted layout shape ($S_{PRED}$) have been described above, it is understood that other possible uses of the physical parameters associated with the parasitic aware blockage shape ($S_{PAB}$) can be used to determine the effective capacitance $C_{EFF}$, depending on the particular capacitance model used to determine the effective capacitance $C_{EFF}$. Thus, while a parallel plate model for determining capacitance is described herein for illustrative purposes, it is understood that any baseline capacitance modeling technique can be used, including more complex analytical formulas, pattern-matching capacitance modeling approaches, and field solver-based modeling approaches. The usage of the physical and electrical parameters stored on the parasitic-aware blockage shapes depends on the baseline capacitance modeling technique used.

Returning now to FIG. 6, after the above-described effective capacitances $C_{EFF}$ have been determined, errors ($E_{PAB}$) between the effective capacitances ($C_{EFF}$) and the corresponding actual capacitances ($C_{OB}$) (calculated during step 602) are determined (Step 606). More specifically, the capacitive error associated with each of the parasitic-aware blockage shapes ($S_{PAB}$) is determined. For example, assume that the original blockage layout shapes 401-402 are represented by the parasitic-aware blockage shape P1 (FIG. 10D), and that the effective capacitances between the parasitic-aware blockage shape P1 and the predicted layout shapes 502 and 503 that overlie over the parasitic-aware blockage shape P1 are represented by $C_{EFF}1$ and $C_{EFF}2$, respectively. Further assume that the predicted layout shape 502 extends over original blockage layout shape 401 (with a corresponding capacitance represented by $C_{OB}1$), and the predicted layout shape 503 extends over original blockage layout shape 503 (with a corresponding capacitance represented by $C_{OB}2$). In this case, the capacitive error $E_{PAB}$ associated with the parasitic-aware blockage shape P1 could be defined as follows.

$$E_{PAB}=((C_{EFF}1+C_{EFF}2)-(C_{OB}1+C_{OB}2))/(C_{OB}1+C_{OB}2)$$

Figure 15:
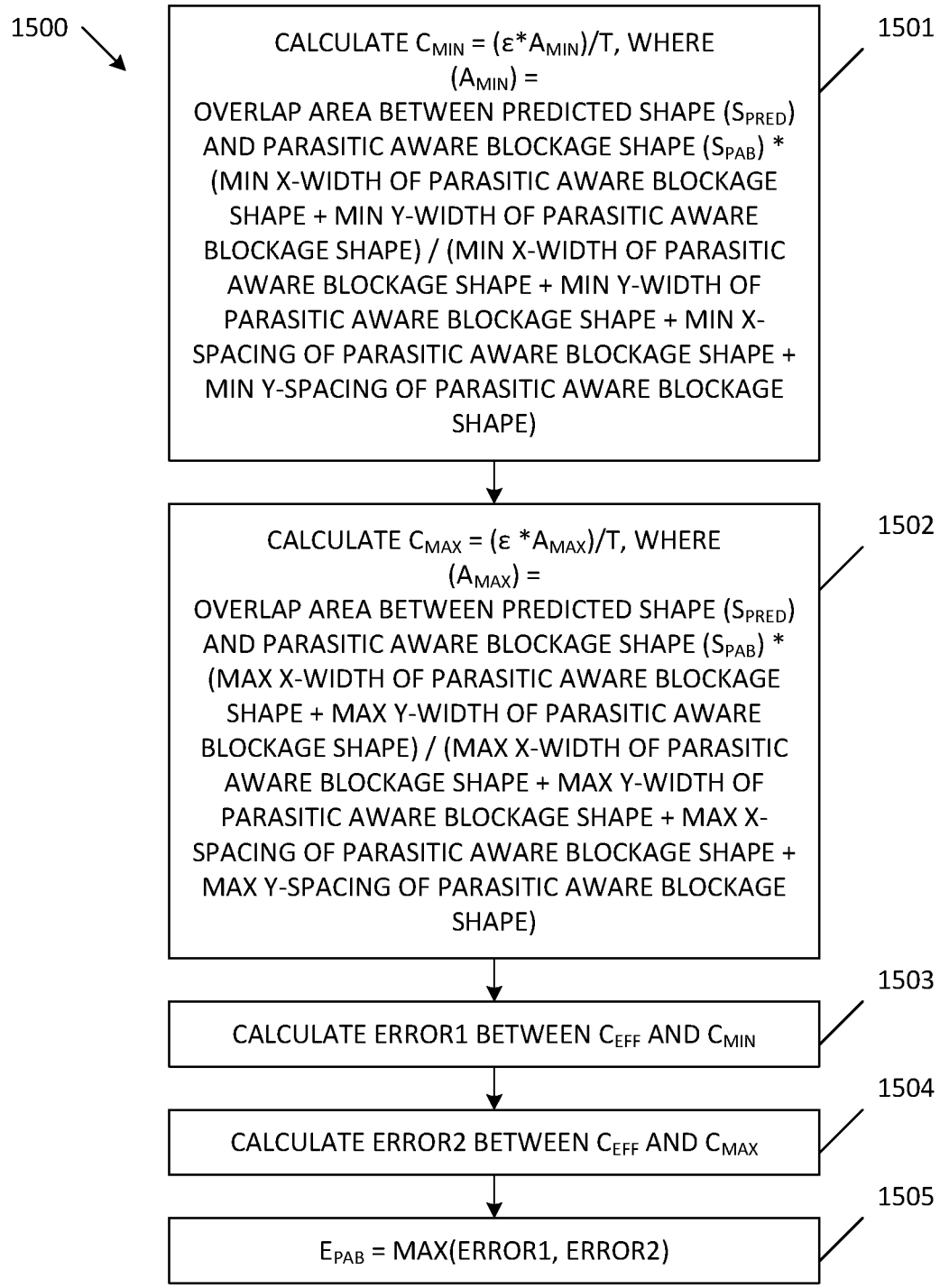
FIG. 15 is a flow diagram illustrating an alternate method for determining capacitive errors associated with parasitic-aware blockage shapes.

FIG. 15 is a flow diagram 1500 illustrating an alternate method for determining the capacitive errors $E_{PAB}$ associated with the parasitic-aware blockage shapes ($S_{PAB}$). Initially, a minimum capacitance ($C_{MIN}$) is determined based on the physical information associated with each of the parasitic-aware blockage shapes (Step 1501). The minimum capacitance ($C_{MIN}$) is defined as follows:

$$C_{MIN}=(\in *A_{MIN})/T$$

wherein $A_{MIN}$ is a minimum overlap area between the parasitic-aware blockage shape ($S_{PAB}$) and the overlying predicted layout shapes ($S_{PRED}$). The minimum overlap area $A_{MIN}$ can be defined as follows.

$A_{DEN}$=Overlap area between predicted layout shape ($S_{PRED}$) and the parasitic-aware blockage shape ($S_{PAB}$)*(Min. X-Width of parasitic-aware blockage shape+Min. Y-Width of parasitic-aware blockage shape)/(Min. X-Width of parasitic-aware blockage shape+Min. Y-Width of parasitic-aware blockage shape+Min. X-Spacing of parasitic-aware blockage shape+Min. Y-Spacing of parasitic-aware blockage shape)

A maximum capacitance ($C_{MAX}$) is then determined based on the physical information associated with each of the parasitic-aware blockage shapes (Step 1502). The maximum capacitance ($C_{MAX}$) is defined as follows:

$$C_{MAX}=(\in *A_{MAX})/T$$

wherein $A_{MAX}$ is a maximum overlap area between the parasitic-aware blockage shape ($S_{PAB}$) and the overlying predicted layout shapes ($S_{PRED}$). The maximum overlap area $A_{MAX}$ can be defined as follows.

$A_{MAX}$=Overlap area between predicted layout shape ($S_{PRED}$) and the parasitic-aware blockage shape ($S_{PAB}$)*(Max. X-Width of parasitic-aware blockage shape+Max. Y-Width of parasitic-aware blockage shape)/(Max. X-Width of parasitic-aware blockage shape+Max. Y-Width of parasitic-aware blockage shape+Max. X-Spacing of parasitic-aware blockage shape+Max. Y-Spacing of parasitic-aware blockage shape)

A first error (Error1) is then calculated between the effective capacitance $C_{EFF}$ of the parasitic-aware blockage shape ($S_{PAB}$) and the minimum capacitance $C_{MIN}$ (Step 1503). For example, Error1 may be equal to $(C_{EFF}-C_{MIN})/C_{EFF}$.

A second error (Error2) is then calculated between the effective capacitance $C_{EFF}$ of the parasitic-aware blockage shape ($S_{PAB}$) and the maximum capacitance C (Step 1504). For example, Error2 may be equal to $(C_{EFF}-C_{MAX})/C_{EFF}$.

The capacitance error $E_{PAB}$ is then selected to be the larger of Error1 or Error 2 (Step 1505).

While the example of FIG. 15 uses the physical dimensions of the parasitic-aware blockage shapes to determine the capacitance error $E_{PAB}$, it is understood that this capacitance error $E_{PAB}$ can alternately be determined using the standard deviations of the physical dimensions of the parasitic-aware blockage shapes. For example, rather than determining the minimum overlap area $A_{MIN}$ using the minimum X-width, minimum Y-width, minimum X-spacing and minimum Y-spacing in the manner described above, the minimum overlap area $A_{MIN}$ can be determined using an "average–N*sigma" approach. For example, assume that the X-width has an average of 1.67 and a standard deviation of 0.58 (see, parasitic-aware blockage shape P2 of Table 2). Using an "average–1*sigma" approach, the term "min X-width" in the $A_{MIN}$ formula becomes "average–1*sigma", which is equal to 1.67–0.58=1.09. Note that this is less conservative than using the minimum X-width value of 1. The minimum Y-width, minimum X-spacing and minimum Y-spacing can similarly be replaced with "average–1*sigma" values in the $A_{MIN}$ formula. In practice, the "average–N*sigma" approach works better if the number of underlying shapes is large, whereas the approach using the various minimum values works better if the number of underlying shapes is small. In accordance with this embodiment, the maximum area overlap A can be determined in a similar manner using "average+N*sigma" calculations.

Returning now to FIG. 6, the capacitance error $E_{PAB}$ for each parasitic-aware blockage shape is compared with a predetermined error threshold ($E_{THRESHOLD}$) (Step 607). If the capacitance error $E_{PAB}$ is less than the predetermined error threshold for each of the parasitic-aware blockage shapes (step 607, YES branch), then each of the capacitance errors $E_{PAB}$ is associated with its corresponding parasitic aware blockage shape ($S_{PAB}$) (Step 608). The process then returns the parasitic-aware blockage shapes $S_{PAB}$ (along with their associated physical information and their associated capacitance errors $E_{PAB}$) as the output of the parasitic-aware blockage determination method (Step 609).

However, if the capacitance error $E_{PAB}$ of each parasitic-aware blockage shape is not less than the predetermined error threshold ($E_{THRESHOLD}$) (Step 607, NO branch), a determination is made whether all possible bloat factors have been attempted to create the parasitic-aware blockage shapes (Step 610). If not (step 610, NO branch), then the bloat factors ($B_{SMALL}$, $B_{LARGE}$) are iteratively adjusted (Step 611), and the process returns to step 604, wherein a new set of parasitic-aware blockage shapes (and associated physical information) are generated using the new bloat factors. In one embodiment, the bloat factors $B_{SMALL}$ and $B_{LARGE}$ are initially set to their largest values (e.g., $B_{SMALL}=B_{LARGE}=1.0$, as illustrated by FIGS. 12A-12D). The bloat factor $B_{LARGE}$ is iteratively reduced to its smallest value (while keeping $B_{SMALL}$ at its largest value). After the bloat factor $B_{LARGE}$ reaches its smallest value, the bloat factors $B_{SMALL}$ and $B_{LARGE}$ are both set to their second largest value, and the process is repeated.

If all possible bloat factors $B_{SMALL}$ and $B_{LARGE}$ have been attempted, and the capacitance error $E_{PAB}$ is still greater than the predetermined threshold error ($E_{THRESHOLD}$) (step 610, YES branch), then the original blockage layout shapes ($S_{OB}$) (each having a corresponding capacitance error $E_{PAB}$ of zero) are returned as the result of the parasitic-aware blockage determination method (Step 612). In this case, the detailed original blockage layout shapes ($S_{OB}$) are used because it is not possible to provide parasitic-aware blockage shapes that meet the predetermined threshold error ($E_{THRESHOLD}$).

Although the iteration of the bloat factors $B_{SMALL}$ and $B_{LARGE}$ have been described, it is understood that this iteration technique can be replaced by more efficient discrete optimization methods, such as integer programming techniques (e.g., branch and bound) in alternate embodiments. In yet other embodiments, different and more numerous classifications beyond 'SMALL' and 'LARGE' can be applied to determine bloat factors for the original blockage layout shapes ($S_{OB}$).

In accordance with one embodiment, a parasitic capacitance extraction tool uses the parasitic-aware blockage shapes ($S_{PAB}$), the associated physical information and the associated capacitance errors $E_{PAB}$ returned by method 600 to calculate parasitic capacitances between the parasitic aware blockage shapes ($S_{PAB}$) and the predicted layout shapes ($S_{PRED}$).

As described above in connection with step 607 (FIG. 6), the capacitance error $E_{PAB}$ of each of the parasitic-aware shapes is compared with the predetermined threshold error ($E_{THRESHOLD}$). However, in an alternate embodiment, the capacitance errors $E_{PAB}$ for all of the parasitic-aware blockage shapes can be weighted and averaged, and this weighted average can be compared to a predetermined error threshold ($E_{TH}$) to determine how to proceed (e.g., to step 608 or step 609). For example, the weighted average of the capacitance errors $E_{PAB}$ for all of the parasitic-aware blockage shapes P1-P4 of FIG. 10D can be determined as follows.

$$E_{PAB\_ALL} = (E_{PAB\_P1}*C_{OB\_P1} + E_{PAB\_P2}*C_{OB\_P2} + E_{PAB\_P3}*C_{OB\_P3} + E_{PAB\_P4}*C_{OB\_P4})/(C_{OB\_P1} + C_{OB\_P2} + C_{OB\_P3} + C_{OB\_P4})$$

wherein $E_{PAB\_Pn}$ is the capacitance error associated with the parasitic-aware blockage shape Pn, and $C_{OB\_Pn}$ is the capacitance of the original blockage shape(s) associated with the parasitic-aware blockage shape Pn. For example, when using the parasitic-aware blockage shapes P1-P4 of FIG. 10D: $C_{OB\_P1}=C_{OB}$ of original blockage shape 401+ $C_{OB}$ of original blockage shape 402; $C_{OB\_P2}=C_{OB}$ of original blockage shape 403*(3/7)+$C_{OB}$ of original blockage shape 404+$C_{OB}$ of original blockage shape 405; $C_{OB\_P3}=C_{OB}$ of original blockage shape 403*(2/7); and, $C_{OB\_P4}=C_{OB}$ of original blockage shape 403*(2/7)+$C_{OB}$ of original blockage shape 406.

Figure 16:
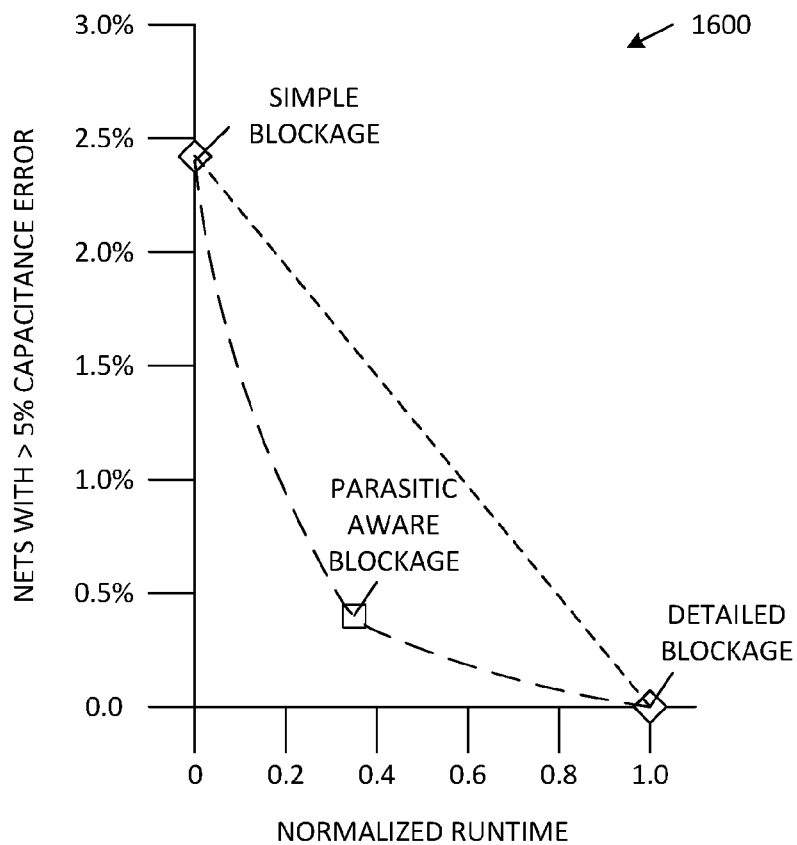
FIG. 16 is a graph illustrating time required to extract parasitic capacitances versus the accuracy of the parasitic capacitance extraction for detailed original blockage layout shapes, simple blockage layout shapes and parasitic-aware blockage layout shapes.
Figure 17:
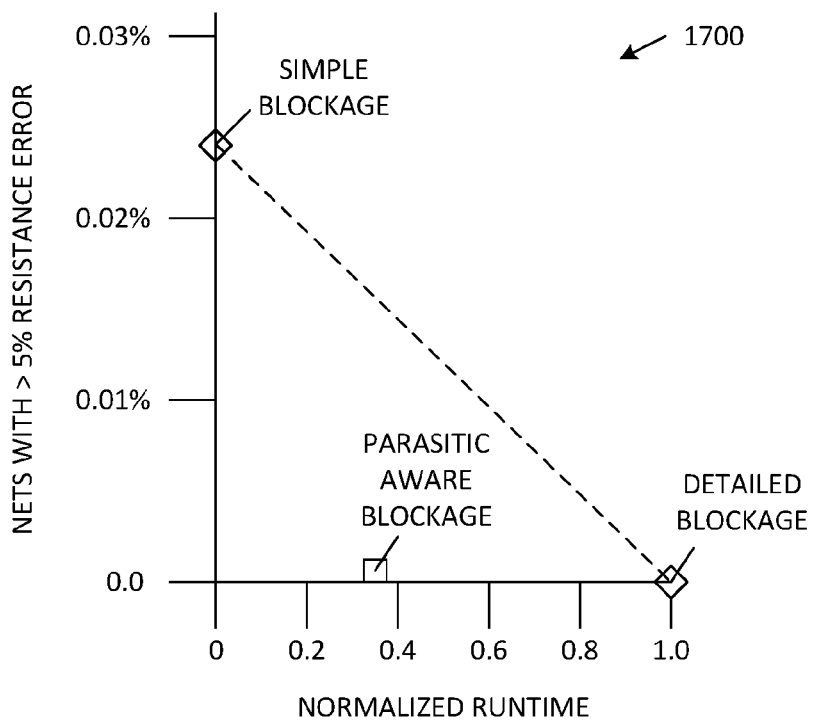
FIG. 17 is a graph illustrating time required to extract the parasitic capacitances versus the accuracy of the associated resistances for detailed original blockage layout shapes, simple blockage layout shapes and parasitic-aware blockage layout shapes.

FIG. 16 is a graph 1600 illustrating the time required to extract parasitic capacitances (normalized to the time required to extract parasitic capacitances using the detailed original blockage layout shapes ($S_{OB}$)) versus the accuracy of the parasitic capacitance extraction (measured by the percentage of nets having a capacitance error of more than 5%). FIG. 17 is a graph 1700 illustrating the time required to extract the parasitic capacitances (normalized to the time required to extract parasitic capacitances using the detailed original blockage layout shapes ($S_{OB}$)) versus the accuracy of the associated resistances (measured by the percentage of nets having a resistance error of more than 5%).

Figure 2B:
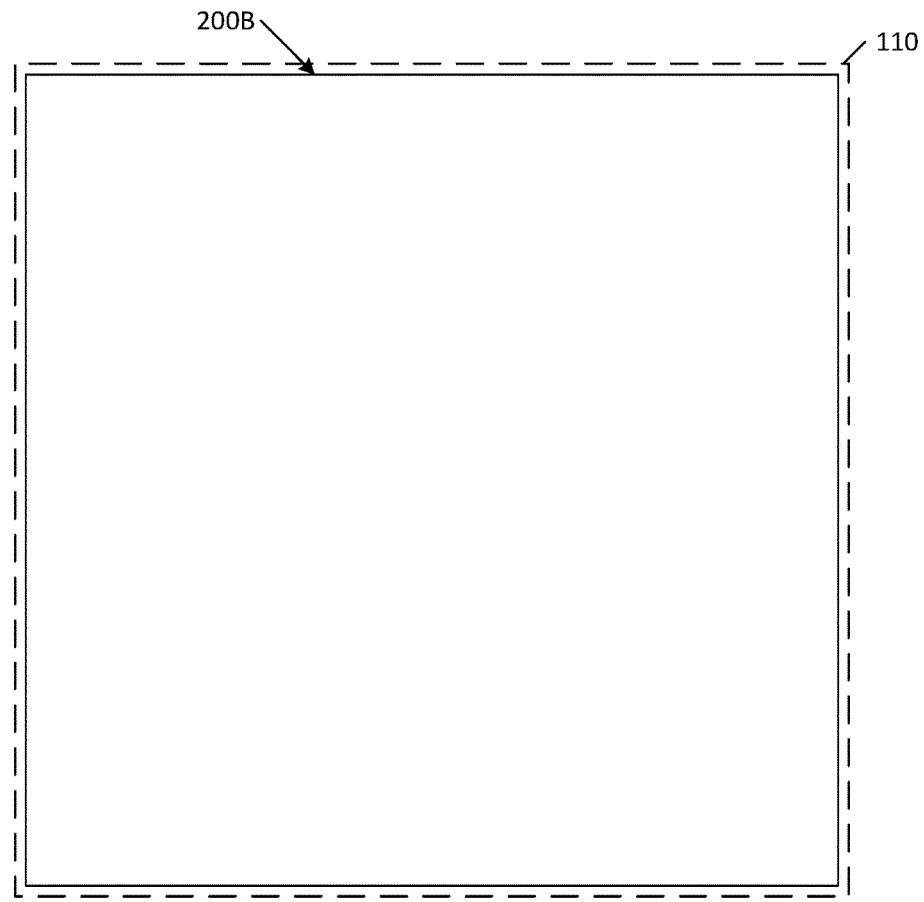
FIG. 2B is a block diagram illustrating a simple blockage pattern that can be used for parasitic capacitance extraction in connection with the top level design of FIG. 1.

As illustrated by FIG. 16, using the original detailed blockage layout shapes ($S_{OB}$) results in no nets with a capacitance error greater than 5%, with a normalized runtime of 1.0. In contrast, using the simplified blockage shapes (see, e.g., FIG. 2B), results in a relatively fast normalized runtime (essentially 0 normalized runtime) with about 2.4% of the nets exhibiting a capacitance error of more than 5%. However, using a parasitic-aware blockage shapes ($S_{PAB}$) results in a normalized run time of about 0.35, and about 0.4% of the nets exhibiting a capacitance error greater than 5%. Thus, using parasitic-aware blockage shapes ($S_{PAB}$) in the manner described above speeds up the parasitic capacitance extraction process by about 2.9× with respect to the detailed original blockage layout shapes ($S_{OB}$). Furthermore, using the parasitic-aware blockage shapes ($S_{PAB}$) in the manner described above results in about 6× fewer nets exhibiting a capacitance error greater than 5%, when compared with a simple blockage representation.

Similarly, as illustrated by FIG. 17, using the original detailed layout shapes ($S_{OB}$) results in no nets with a resistance error greater than 5%, with a normalized runtime of 1.0. In contrast, using the simplified blockage shapes (see, e.g., FIG. 2B), results in a relatively fast normalized runtime (essentially 0 normalized runtime) with about 0.024% of the nets exhibiting a resistance error of more than 5%. However, using the parasitic-aware blockage shapes ($S_{PAB}$) results in a normalized run time of about 0.35, and about 0.0005% of the nets exhibiting a resistance error greater than 5%. Thus, using parasitic-aware blockage shapes ($S_{PAB}$) in the manner described above results in about 50× fewer nets exhibiting a resistance error greater than 5%, when compared with a simple blockage representation. More improvement in speed and accuracy may be obtained if the parasitic-aware blocking method is applied to blockages representing larger macros.

In an alternate embodiment, the parasitic-aware blockage shapes ($S_{PAB}$) can be used without the associated physical information, which may result in a loss in accuracy, but a faster parasitic capacitance extraction runtime.

Although particular methods for computing the predicted layout shapes ($S_{PRED}$) have been described, other possibilities for determining the predicted layout shapes can be used. For example, the approach used can be determined based on a pre-characterization of the designs where the parasitic-aware blockage will be used.

The examples described above do not discuss capacitance errors due to the shielding impact of the blockages, or resistance errors due to process variations. These metrics can be evaluated in a manner similar to the capacitances between the predicted layout shapes and the parasitic-aware blockage shapes described in the examples above.

As described above, the parasitic-aware blockage shapes ($S_{PAB}$) can be generated based on the physical characteristics of the original blockage layout shapes ($S_{OB}$). In accordance with another embodiment, the parasitic-aware blockage shapes ($S_{PAB}$) can also be generated based on coupling capacitance errors due to shielding. For example, the coupling capacitances between the various conductors 501-506 of the predicted layout shapes ($S_{PRED}$) are affected by the presence of the underlying original blockage layout shapes ($S_{OB}$) 401-406. Replacing the original blockage layout shapes ($S_{OB}$) with the parasitic-aware blockage shapes ($S_{PAB}$) may introduce errors to the coupling capacitances between the predicted layout shapes ($S_{PRED}$). To account for these errors, the processes described above can be modified in the following manner.

In the method of FIG. 6, the step of determining the ground capacitances ($C_{OB}$) between the original blockage layout shapes ($S_{OB}$) and the predicted layout shapes ($S_{PRED}$) (step 602) can be replaced with a step of determining the coupling capacitances ($CC_{OB}$) between the predicted layout shapes ($S_{PRED}$) when the original blockage layout shapes ($S_{OB}$) are present.

The method of FIG. 6 can further be modified to replace the step of determining the ground capacitances ($C_{PAB}$) between the parasitic-aware blockage shapes ($S_{PAB}$) and the predicted layout shapes ($S_{PRED}$) (step 605) with a step of determining the coupling capacitances ($CC_{PAB}$) between the predicted layout shapes ($S_{PRED}$) when the parasitic-aware blockage shapes ($S_{PAB}$) are present. In this embodiment, coupling capacitance errors ($E_{CCPAB}$) associated with the parasitic-aware blockage shapes ($S_{PAB}$) are calculated by comparing the coupling capacitances ($CC_{OB}$) with the coupling capacitances ($CC_{PAB}$) (in a manner similar to that described above in connection with step 606). If the coupling capacitance errors ($E_{CCPAB}$) are less than a predetermined threshold (in a manner analogous to step 607), then the coupling capacitance errors ($E_{CCPAB}$) are attached to the corresponding parasitic-aware blockage shapes ($S_{PAB}$) (in a manner analogous to step 608).

In accordance with another embodiment, the parasitic-aware blockage shapes ($S_{PAB}$) can also be generated based on resistance errors due to process variations. Due to sub-wavelength lithographic effects, the width of a conductor depends on the spacing between the conductor and nearby conductors in advanced process technologies. Due to the planarization of copper interconnect from the CMP process used in IC fabrication, the thickness of a conductor depends on its width and the width/spacing/density of nearby conductors. Because the parasitic aware-blockage shapes ($S_{PAB}$) may change the width/spacing/density of other adjacent conductors (in the same metal layer), the parasitic-aware blockage shapes ($S_{PAB}$) may change the resistances of these adjacent conductors when compared to the resistances resulting from the original blockage layout shapes ($S_{OB}$). For example, the resistances of conductors located by immediately adjacent to the original blockage layout shapes ($S_{OB}$) 401-406 are affected by the width/spacing/density of the original blockage layout shapes ($S_{OB}$). Replacing the original blockage layout shapes ($S_{OB}$) with the parasitic-aware blockage shapes ($S_{PAB}$) may introduce errors to the resistances of these adjacent conductors. This change in resistance can be viewed as another error source for the parasitic-aware blockage shapes ($S_{PAB}$) that can be optimized/controlled in the same manner described above for errors in ground capacitances between the parasitic-aware blockage shapes and the predicted layout shapes ($S_{PRED}$), or in the same manner described above for errors in the coupling capacitances between the predicted layout shapes ($S_{PRED}$) due to the parasitic-aware blockage shapes. To account for these resistance errors, the processes described above can be modified in the following manner.

In the method of FIG. 6, the step of determining the ground capacitances ($C_{OB}$) between the original blockage layout shapes ($S_{OB}$) and the predicted layout shapes ($S_{PRED}$) (step 602) can be replaced with a step of determining the resistances ($R_{OB}$) of conductors ($S_A$) fabricated adjacent to the original blockage layout shapes ($S_{OB}$). For example, the resistance of a conductor ($S_A$) fabricated immediately adjacent to original blockage layout shapes 404-406 may be determined.

The method of FIG. 6 can further be modified to replace the step of determining the ground capacitances ($C_{PAB}$) between the parasitic-aware blockage shapes ($S_{PAB}$) and the predicted layout shapes ($S_{PRED}$) (step 605) with a step of determining the resistances ($R_{PAB}$) of the conductors ($S_A$) fabricated adjacent to the parasitic-aware blockage shapes ($S_{PAB}$). In this embodiment, resistance errors ($E_{RPAB}$) associated with the parasitic-aware blockage shapes ($S_{PAB}$) are calculated by comparing the resistances ($R_{OB}$) with the resistances ($R_{PAB}$) (in a manner similar to that described above in connection with step 606). If the resistance errors ($E_{RPAB}$) are less than a predetermined threshold (in a manner analogous to step 607), then the resistance errors ($E_{RPAB}$) are attached to the corresponding parasitic-aware blockage shapes ($S_{PAB}$) (in a manner analogous to step 608).

Figure 18:
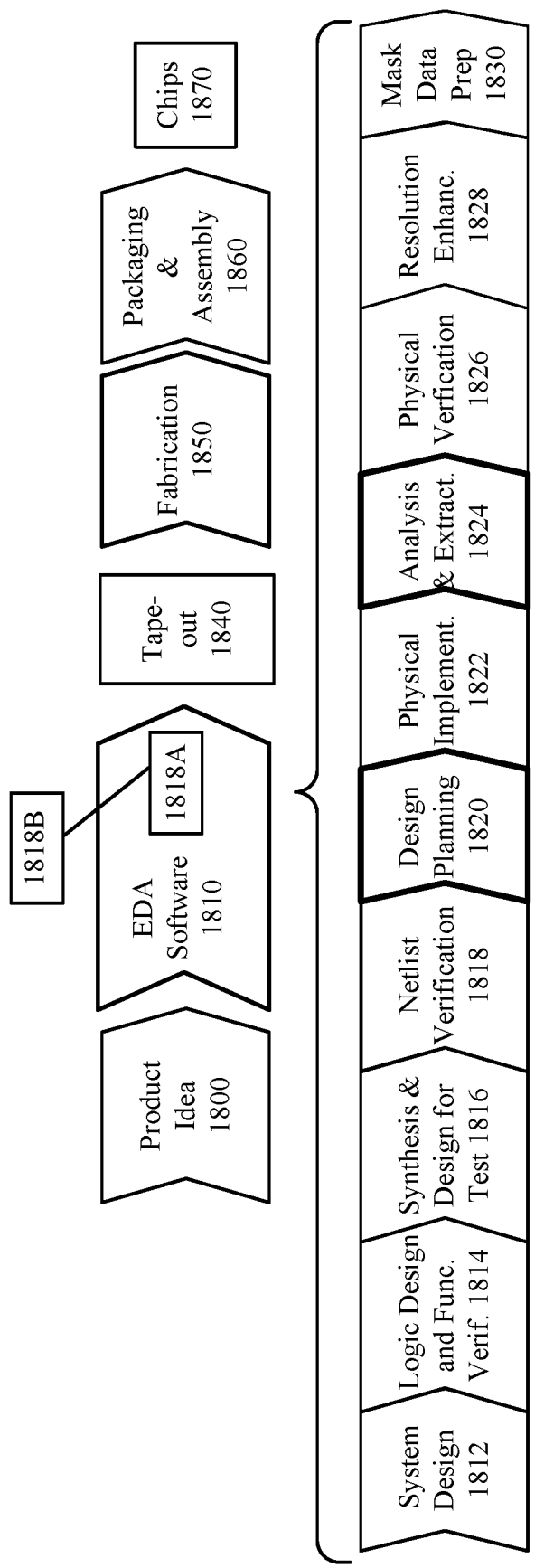
FIG. 18 is a block diagram of a simplified representation of an exemplary digital ASIC design flow including the processes for determining parasitic-aware blockage shapes and extracting parasitic capacitances between the parasitic-aware blockage shapes and predicted layout shapes.

FIG. 18 is a block diagram of a simplified representation of an exemplary digital ASIC design flow including the processes for determining parasitic-aware blockage shapes ($S_{PAB}$) and extracting parasitic capacitances between the parasitic-aware blockage shapes and predicted layout shapes ($S_{PRED}$) as described above. At a high level, the process starts with the product idea (step 1800) and is realized in an EDA software design process (step 1810). When the design is finalized, it can be taped-out (event 1840). After tape out, the fabrication process (step 1850) and packaging and assembly processes (step 1860) occur resulting, ultimately, in finished chips (result 1870). In accordance with various embodiments, the above-described methods of determining parasitic-aware blockage shapes ($S_{PAB}$) (as well as the associated physical information and the corresponding capacitance errors ($E_{PAB}$)) and performing the parasitic capacitance extraction, can be implemented in the EDA software design process (step 1810).

The EDA software design process (step 1810) is actually composed of a number of steps 1812-1830, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1810) will now be provided. In one embodiment, one or more steps of the EDA software design process can be implemented using a computer-readable medium 1811A, which is read by a computer 1811B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 1812): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 1814): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products.

Synthesis and design for test (step 1816): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1818): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1820): Here, an overall floorplan for the chip is constructed and analyzed for timing and top-level routing. Exemplary EDA software products from Synopsys, Inc. that can be used at this step include Astro™ and IC Compiler™ products. In accordance with various embodiments, the above-described methods for determining parasitic-aware blockage shapes ($S_{PAB}$) (as well as the associated physical information and the corresponding capacitance errors ($E_{PAB}$)) and performing the parasitic capacitance extraction, can be implemented in design planning step 1820.

Physical implementation (step 1822): The placement (positioning of circuit elements) and routing (connection of the same) occurs at this step. In accordance with various embodiments, the above-described methods for determining parasitic-aware blockage shapes ($S_{PAB}$) (as well as the associated physical information and the corresponding capacitance errors ($E_{PAB}$)) and performing the parasitic capacitance extraction, can be implemented during the place and route process associated with step 1822. Exemplary EDA software products from Synopsys, Inc. that can be used at this step include the Astro™ and IC Compiler™ products.

Analysis and extraction (step 1824): At this step, the circuit function is verified at a transistor level, this in turn permits what-if refinement. Exemplary EDA software products from Synopsys, Inc. that can be used at this step include AstroRail™, PrimeRail™, Primetime®, and Star RC/XT™ products. In accordance with various embodiments, the above-described methods of for determining parasitic-aware blockage shapes ($S_{PAB}$) (as well as the associated physical information and the corresponding capacitance errors ($E_{PAB}$)) and performing the parasitic capacitance extraction, can be implemented in step 1824.

In accordance with one embodiment, a computer readable medium 1811A stores instructions, which when executed by a processor 1811B, will implement the above-described method(s) for determining parasitic-aware blockage shapes ($S_{PAB}$) (as well as the associated physical information and the corresponding capacitance errors ($E_{PAB}$)) as described above. If these parasitic-aware blockage shapes ($S_{PAB}$) cause the transmission characteristics of the predicted layout shapes ($S_{PRED}$) to fall outside of a desired range, then the original IC design can be modified in order to change the top level design.

The above-described method(s) for determining parasitic-aware blockage shapes ($S_{PAB}$) can then be applied to the modified IC design, and the results can be used to determine whether the transmission characteristics of the predicted layout shapes ($S_{PRED}$) are acceptable. This process can be repeated until the transmission characteristics of the predicted layout shapes ($S_{PRED}$) are determined to be acceptable.

Physical verification (step 1826): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 1828): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 1830): This step provides the "tape-out" data for production of masks for lithographic use to produce finished chips. Exemplary EDA software products from Synopsys, Inc. that can be used at this step include the CATS® family of products.

Although illustrative embodiments of the invention have been described in detail herein with reference to the accompanying figures, it is to be understood that the invention is not limited to those precise embodiments. Thus, the scope of the invention is defined by the following claims and their equivalents.

We claim:

1. A method for extracting parasitic capacitances associated with a detailed blockage structure, the method comprising:
    deriving one or more parasitic-aware blockage polygons from the detailed blockage structure, wherein each of the one or more parasitic-aware blockage polygons represents a plurality of polygons of the detailed blockage structure;
    associating physical information with each of the one or more parasitic-aware blockage polygons, wherein the physical information represents physical characteristics of the represented plurality of polygons of the detailed blocking structure;
    using a processor to extract parasitic capacitances that exist between the detailed blocking structure and an adjacent interconnect structure, wherein the processor extracts the parasitic capacitances based on the one or more parasitic-aware blockage polygons and the associated physical information.

2. The method of claim 1, wherein the physical information includes a density of the detailed blockage structure with respect to the one or more parasitic-aware blockage polygons.

3. The method of claim 1, wherein the physical information includes minimum and maximum widths of the polygons of the detailed blockage structure represented by the one or more parasitic-aware blockage polygons.

4. The method of claim 1, wherein the physical information includes minimum and maximum spacings of the polygons of the detailed blockage structure represented by the one or more parasitic-aware blockage polygons.

5. The method of claim 1, wherein the physical information includes average widths and spacings of the polygons of the detailed blockage structure represented by the one or more parasitic-aware blockage polygons.

6. The method of claim 1, wherein the physical information includes standard deviations of the polygons of the detailed blockage structure with respect to the one or more parasitic-aware blockage polygons.

7. The method of claim 1, further comprising associating electrical information with each of the one or more parasitic-aware blockage polygons, wherein the electrical information defines electrical characteristics of the associated one or more parasitic-aware blockage polygons.

8. The method of claim 7, wherein the electrical characteristics comprise a capacitance error introduced by the one or more parasitic-aware blockage polygons.

9. The method of claim 8, wherein the capacitance error specifies a difference between a first capacitance between the detailed blockage structure and one or more adjacent conductors and a second capacitance between the parasitic-aware blockage polygons and the one or more adjacent conductors.

10. The method of claim 8, wherein the capacitance error specifies a difference between a first coupling capacitance between a plurality of conductors when located adjacent to the detailed blockage structure and a second coupling capacitance between the plurality of conductors when located adjacent to the parasitic-aware blockage polygons.

11. The method of claim 7, wherein the electrical characteristics comprise a resistance error introduced by the one or more parasitic-aware blockage polygons.

12. The method of claim 11, wherein the resistance error specifies a difference between a first resistance of a conductor when fabricated adjacent to the detailed blockage structure, and a second resistance of the conductor when fabricated adjacent to the one or more parasitic-aware blockage polygons.

13. A system for extracting parasitic capacitances associated with a detailed blockage structure, the system comprising:
   means for deriving one or more parasitic-aware blockage polygons from the detailed blockage structure, wherein each of the one or more parasitic-aware blockage polygons represents a plurality of polygons of the detailed blockage structure;
   means for associating physical information with each of the one or more parasitic-aware blockage polygons, wherein the physical information represents physical characteristics of the represented plurality of polygons of the detailed blocking structure; and
   a processor that extracts parasitic capacitances that exist between the detailed blocking structure and an adjacent interconnect structure, wherein the processor extracts the parasitic capacitances based on the one or more parasitic-aware blockage polygons and the associated physical information.

14. The system of claim 13, further comprising:
   means for deriving electrical characteristics associated with each of the one or more parasitic-aware blockage polygons; and
   means for associating the electrical characteristics with each of the one or more parasitic-aware blockage polygons.

15. The system of claim 14, wherein the electrical characteristics specify capacitance errors introduced by the one or more parasitic-aware blockage polygons with respect to the detailed blockage structure.

16. The system of claim 15, wherein one of the capacitance errors specifies a difference between a first capacitance between the detailed blockage structure and one or more adjacent conductors and a second capacitance between the parasitic-aware blockage polygons and the one or more adjacent conductors.

17. The system of claim 13, wherein the electrical characteristics specify a resistance error introduced by the one or more parasitic-aware blockage polygons.

18. The system of claim 13, wherein the physical information includes a density of the detailed blockage structure with respect to the one or more parasitic-aware blockage polygons.

19. The system of claim 13, wherein the physical information includes minimum and maximum widths of the polygons of the detailed blockage structure represented by the one or more parasitic-aware blockage polygons.

20. The system of claim 13, wherein the physical information includes minimum and maximum spacings of the polygons of the detailed blockage structure represented by the one or more parasitic-aware blockage polygons.

21. The system of claim 13, wherein the physical information includes average widths and spacings of the polygons of the detailed blockage structure represented by the one or more parasitic-aware blockage polygons.

22. The system of claim 13, wherein the physical information includes standard deviations of the polygons of the detailed blockage structure with respect to the one or more parasitic-aware blockage polygons.

* * * * *